(12) United States Patent
Villarreal et al.

(10) Patent No.: US 9,134,530 B2
(45) Date of Patent: Sep. 15, 2015

(54) DISPLAY APPARATUS INCORPORATING DUAL-LEVEL SHUTTERS

(71) Applicant: Pixtronix, Inc., San Diego, CA (US)

(72) Inventors: Javier Villarreal, Somerville, MA (US); Timothy Brosnihan, Natick, MA (US); Mark B. Andersson, Northborough, MA (US); Edward Buckley, Melrose, MA (US); Eugene Fike, Amesbury, MA (US)

(73) Assignee: Pixtronix, Inc., San Diego, CA (US)

( * ) Notice: Subject to any disclaimer, the term of this patent is extended or adjusted under 35 U.S.C. 154(b) by 46 days.

(21) Appl. No.: 13/800,418

(22) Filed: Mar. 13, 2013

(65) Prior Publication Data

US 2014/0267196 A1    Sep. 18, 2014

(51) Int. Cl.
*G09G 5/00* (2006.01)
*H05K 13/00* (2006.01)
*G02B 26/02* (2006.01)
*B81B 3/00* (2006.01)

(52) U.S. Cl.
CPC .............. *G02B 26/02* (2013.01); *B81B 3/0054* (2013.01); *G02B 26/023* (2013.01); *G09G 5/003* (2013.01); *B81B 2201/045* (2013.01)

(58) Field of Classification Search
None
See application file for complete search history.

(56) References Cited

U.S. PATENT DOCUMENTS

| | | | |
|---|---|---|---|
| 7,304,786 B2* | 12/2007 | Hagood et al. | 359/290 |
| 7,405,852 B2 | 7/2008 | Hagood, IV et al. | |
| 7,417,782 B2 | 8/2008 | Hagood et al. | |
| 7,486,867 B2 | 2/2009 | Wang | |
| 7,898,714 B2 | 3/2011 | Hagood, IV et al. | |
| 7,995,262 B2 | 8/2011 | Higuchi et al. | |
| 7,995,263 B1 | 8/2011 | Ruan | |
| 2008/0037104 A1 | 2/2008 | Hagood et al. | |
| 2008/0158635 A1 | 7/2008 | Hagood et al. | |
| 2011/0043882 A1 | 2/2011 | Yoon et al. | |
| 2012/0154455 A1 | 6/2012 | Steyn et al. | |
| 2012/0250132 A1 | 10/2012 | Yoon et al. | |
| 2012/0293852 A1 | 11/2012 | Cho et al. | |
| 2012/0306830 A1 | 12/2012 | Kimura et al. | |
| 2013/0050290 A1 | 2/2013 | Andersson et al. | |
| 2013/0050794 A1 | 2/2013 | Yun et al. | |
| 2014/0267331 A1 | 9/2014 | Villarreal et al. | |

FOREIGN PATENT DOCUMENTS

JP    2010210813 A    9/2010

OTHER PUBLICATIONS

International Search Report and Written Opinion—PCT/US2014/020822—ISA/EPO—May 28, 2014.

* cited by examiner

*Primary Examiner* — Muhammad N Edun
(74) *Attorney, Agent, or Firm* — Edward A. Gordon; Foley & Lardner LLP

(57) ABSTRACT

This disclosure provides systems, methods and apparatus for modulating light to form an image on a display, as well as methods manufacturing such apparatus. The display apparatus includes shutters having asymmetric light obstructing portions extending out from opposing sides of a shutter aperture along an axis of motion of the shutter. Actuators move the shutters laterally along the axis of motion to move the shutter between fully closed, partially open, and fully open states to modulate light, thereby forming an image.

34 Claims, 36 Drawing Sheets

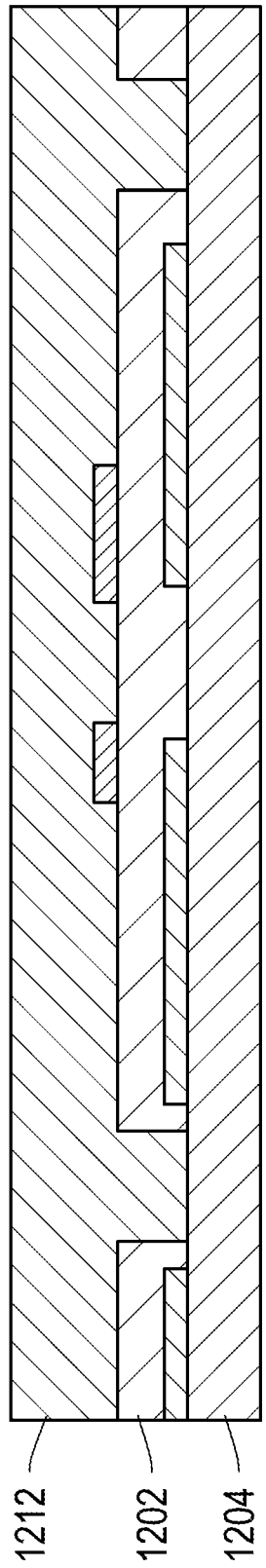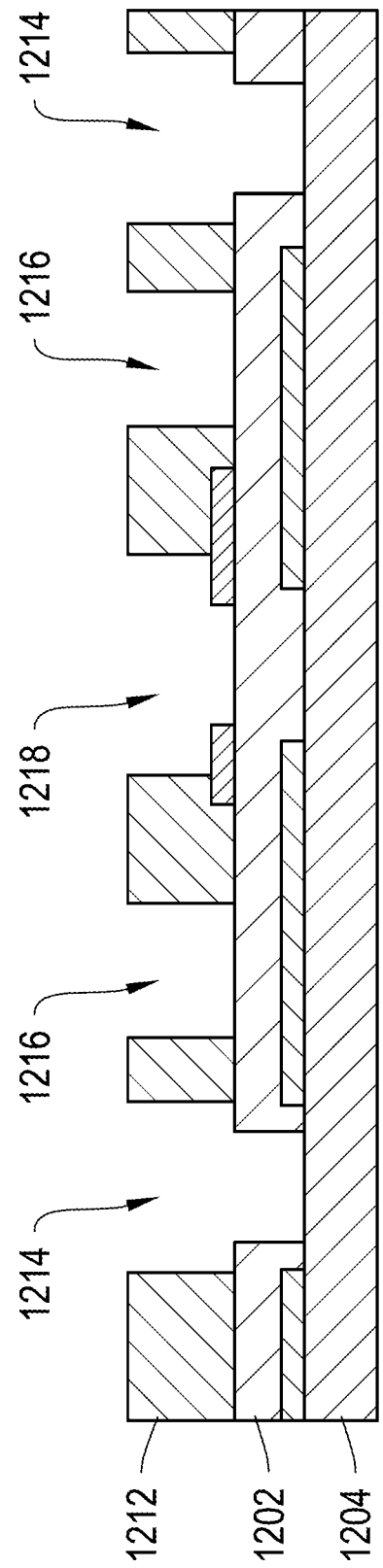

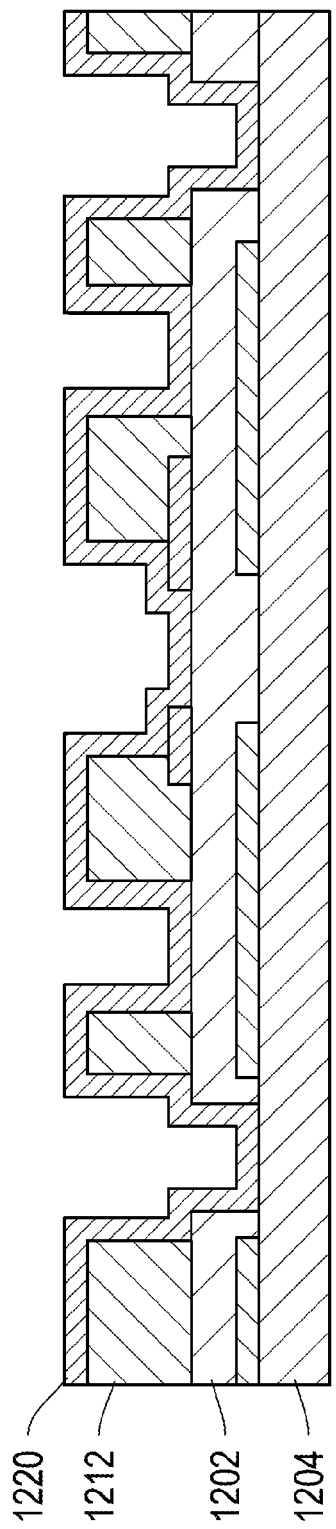
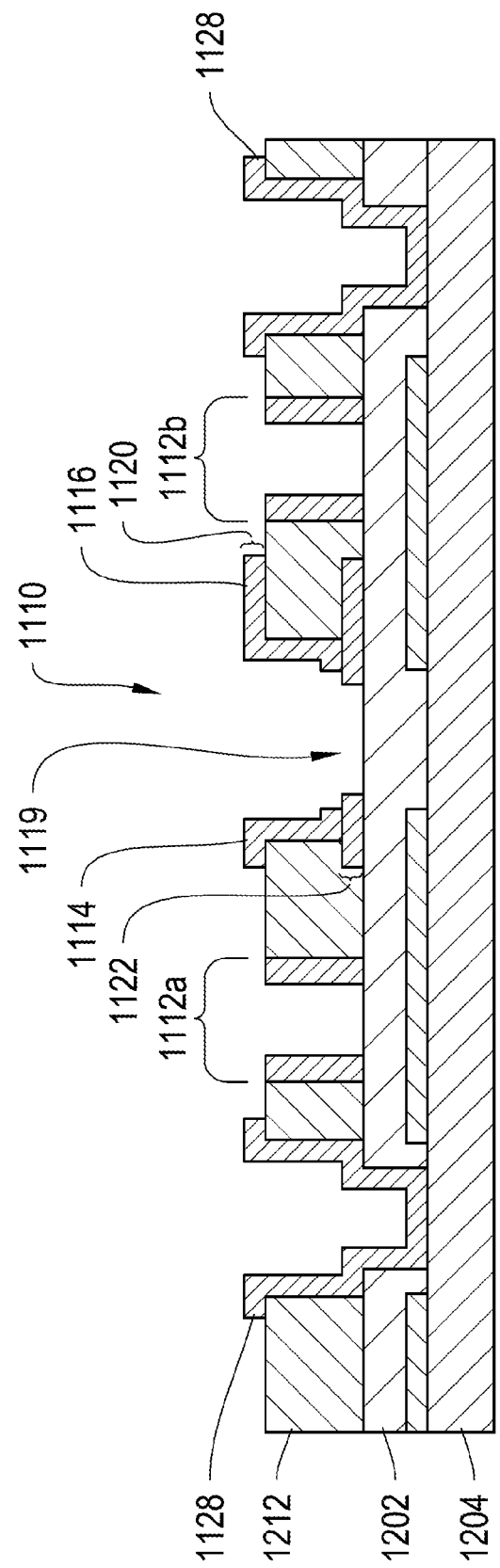
FIGURE 12G
FIGURE 12H

DISPLAY APPARATUS INCORPORATING DUAL-LEVEL SHUTTERS

TECHNICAL FIELD

This disclosure relates to electromechanical systems (EMS). In particular, this disclosure relates to EMS shutter designs.

DESCRIPTION OF THE RELATED TECHNOLOGY

The demand for improved contrast ratio in displays continues to increase. Certain shutter-based EMS display devices experience decreased contrast ratios resulting from light leaking around the light modulating shutters they include. For example, certain shutter-based EMS displays include shutters that move laterally between two opposing light blocking layers. The light blocking layers include apertures, which the shutters selectively obstruct to modulate light. However, typical shutter designs are more effective at obstructing light passing through one of the light blocking layers than the other. Insufficient obstruction of the apertures in the other light blocking layer can contribute to a reduced contrast ratio.

Moreover, there are few if any EMS-based light modulators that can reliably achieve discrete partially transmissive states between a fully dark and a fully light state. Thus, displays incorporating EMS-based light modulators tend to generate different gray scale values using principles of time division by driving the light modulators into light or dark states in a series of subframes. Even if such subframes are weighted, such displays may still need to generate a large number of subframes per image frame to obtain the level of grayscale granularity desired.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus that includes a first light blocking layer and a shutter. The first light blocking layer includes an aperture formed through it. The shutter is configured to be moved laterally along a first axis with respect to the light blocking layer by at least one actuator. The shutter can include a first light obstructing portion which has a dimension along the first axis that is smaller than a dimension of the aperture along the first axis. The shutter also includes a second light obstructing portion that has a dimension along the first axis that is greater than or equal to the dimension of the aperture along the first axis. In some implementations, the at least one actuator is configured to move the shutter into a first state in which neither the first or the second light obstructing portion substantially obstructs light passing through aperture, a second state in which the first light obstructing portion obstructs a fraction of light passing through the aperture, and a third state in which the second light obstructing portion obstructs substantially all of the light passing through the aperture.

In some implementations, each of the first and second light obstructing portions of the shutter includes a proximal light obstructing and distal light obstructing level, which are connected by sidewalls. In some such implementations, the at least one actuator includes an electrode positioned adjacent the shutter, and the proximal light obstructing level is positioned at about the same height over a substrate as a proximal edge of the electrode. In some implementations, the distal light obstructing level is positioned at about the same height over a substrate as a distal edge of the electrode.

In some implementations, the proximal light obstructing level is spaced from the first light blocking layer by about the same distance as the distal light obstructing level is spaced from a second light blocking layer positioned opposite the shutter from the first light blocking layer. In some other implementations, the proximal light obstructing level is spaced from the first light blocking layer by a distance that is less than about 3 microns different from a distance with which the distal light obstructing level is spaced from a second light blocking layer positioned opposite the shutter from the first light blocking layer.

In some implementations, the at least one actuator includes a first actuator and a second actuator. In some such implementations, the first actuator is configured to, upon actuation, pull the shutter into the first state. In some implementations, the second actuator is configured to, upon actuation, pull the shutter into the third state. In some other implementations, the first and second actuators are configured such that when neither the first or second actuator is actuated, the shutter is in the second state.

In some implementations, the apparatus includes a display, a processor, and a memory device. The display can include the shutter. The processor can be configured to communicate with the display and to process image data. The memory device is configured to communicate with the processor. In some implementations, the apparatus also includes a driver circuit configured to send at least one signal to the display, and the processor is further configured to send at least a portion of the image data to the driver circuit. In some implementations, the apparatus includes an image source module configured to send the image data to the processor. The image source module can include at least one of a receiver, transceiver, and a transmitter. In some implementations, the apparatus can also include an input device configured to receive input data and to communicate the input data to the processor.

Another innovative aspect of the subject matter described in this disclosure can be implemented in a method of manufacturing a display element. The method includes defining a first aperture in a first light blocking layer, depositing a first layer of sacrificial material over the first light blocking layer, and depositing at least a first layer of structural material over the first layer of sacrificial material. The method also includes patterning at least the first layer of structural material to define a perimeter of a shutter, a shutter aperture through the shutter, and at least one actuator. The shutter perimeter and the shutter aperture are configured such that the shutter includes asymmetric first and second light obstructing portions positioned on opposite sides of the shutter aperture along an axis of motion of the shutter. The actuator is configured to move the shutter along the axis of motion into a relaxed state in which neither the first nor the second light obstructing portions substantially obstructs light passing through the first aperture, a first actuated state in which the first light obstructing portion obstructs a fraction of light passing through the first aperture, and a second actuated state in which the second light obstructing portion obstructs substantially all of the light passing through the first aperture.

In some implementations, the method further includes depositing a second layer of sacrificial material over the first layer of structural material. Depositing at least a first layer of structural material over the first layer of sacrificial material can include depositing a second layer of structural material over the second layer of sacrificial material. In some such implementations, patterning at least the first layer of structural material includes both patterning the first layer of structural material prior to the deposition of the second layer of sacrificial material and then patterning the second layer of structural material after the deposition of the second layer of structural material.

In some implementations, the method also includes patterning the second layer of sacrificial material to form a recess in the second layer of sacrificial material surrounding the shutter aperture defined in the first layer of structural material. In some such implementations, depositing the second layer of structural material includes coating sidewalls of the recess in the second sacrificial layer with the second layer of structural layer.

Details of one or more implementations of the subject matter described in this specification are set forth in the accompanying drawings and the description below. Although the examples provided in this summary are primarily described in terms of MEMS-based displays, the concepts provided herein may apply to other types of displays, such as liquid crystal displays (LCD), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

FIGS. 12A-12H show cross sectional views of example stages of the fabrication of the shutter assembly shown in FIGS. 11A-11D.

Like reference numbers and designations in the various drawings indicate like elements.

DETAILED DESCRIPTION

Figure 1A:
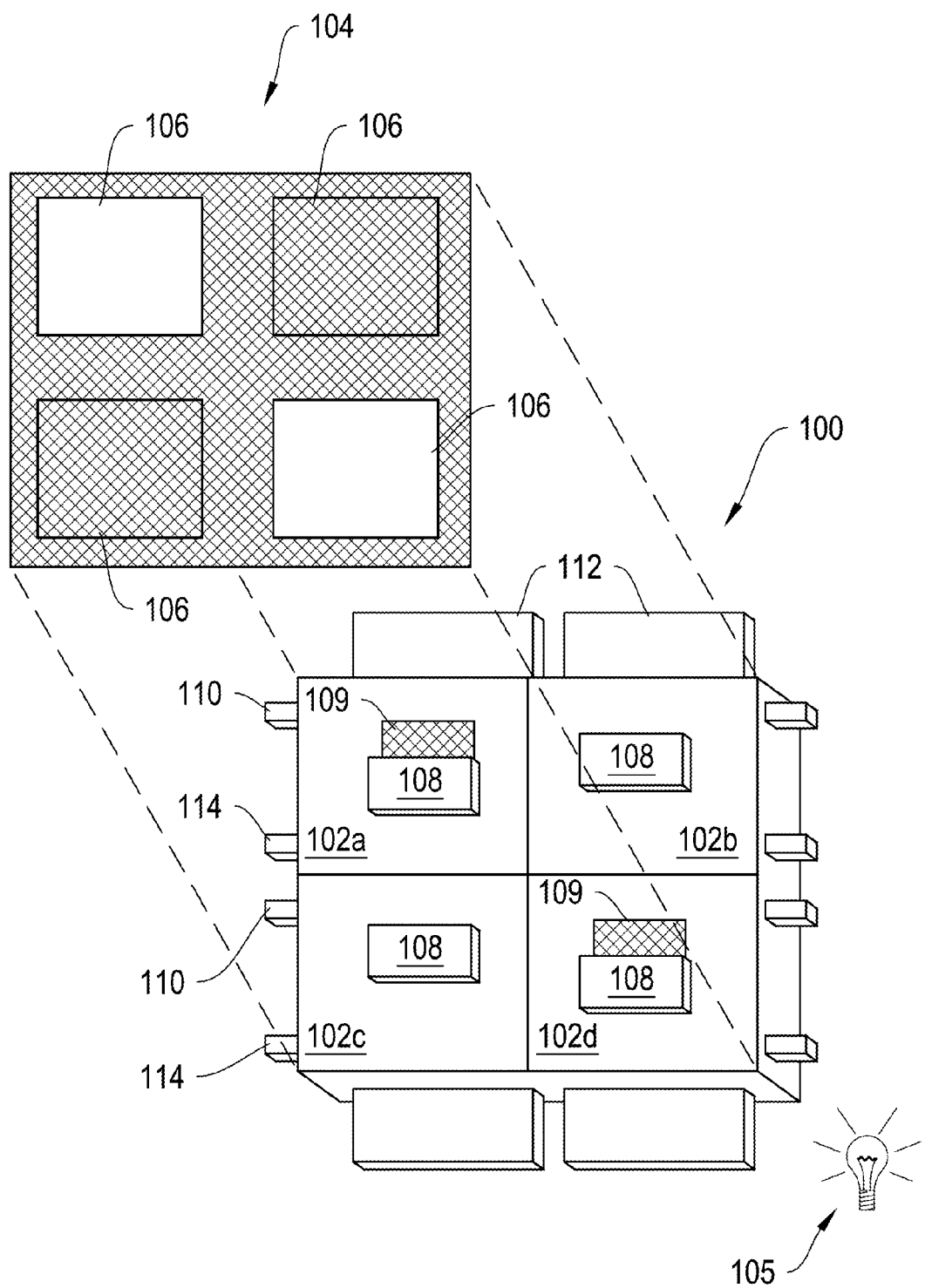
FIG. 1A shows a schematic diagram of an example direct-view MEMS-based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

A multi-state shutter can be fabricated having two light obstructing portions positioned on opposite sides of a shutter aperture. The shutter is moved laterally with respect to apertures formed in front and rear light blocking layers positioned adjacent the shutter by opposing actuators coupled to the shutter. One light obstructing portion is substantially longer than the other. Thus, when the longer light obstructing portion is placed in front of an aperture (when one actuator is actuated), it blocks substantially all of the light propagating through the aperture. When the shorter light obstructing portion is positioned in front of the aperture (when the opposing actuator is actuated), it only blocks a fraction of the light passing through. In a third state (when both actuators are relaxed), the shutter aperture aligns with the apertures in the light blocking layers, and little to no light is obstructed by the shutter. Such a shutter can also advantageously incorporate upper and lower light obstructing levels to improve its contrast ratio.

Particular implementations of the subject matter described in this disclosure can be implemented to realize one or more of the following potential advantages. Shutters having asymmetric light obstructing portions extending outwards from a shutter aperture can be moved between three states, a closed state, a partially open state, and a fully open state. By including shutter assemblies that can achieve the additional partially open state, a display apparatus can form an image using fewer subframes.

In some implementations, shutters having asymmetric light obstructing portions can be fabricated to have both front and rear light obstructing levels. Shutter assemblies incorporating shutters having both front and rear obstructing levels provide improved light management capabilities. By positioning light obstructing levels in close proximity to apertures formed in light blocking layers located on either side of the shutter, the shutter can effectively prevent undesirable leakage of light exiting the backlight at low angles with respect to the substrate. The shutter can also effectively reduce ambient light reflections. The result of this improved light management is an enhanced display contrast ratio.

FIG. 1A shows a schematic diagram of an example direct-view MEMS-based display apparatus 100. The display apparatus 100 includes a plurality of light modulators 102a-102d (generally "light modulators 102") arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide luminance level in an image 104. With respect to an image, a "pixel" corresponds to the smallest picture element defined by the resolution of the image. With respect to structural components of the display apparatus 100, the term "pixel" refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or "backlight" so that each pixel can be uniformly illuminated. Transmissive direct-view displays are often built onto transparent or glass substrates to facilitate a sandwich assembly arrangement where one substrate, containing the light modulators, is positioned directly on top of the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (e.g., interconnects 110, 112 and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, VWE"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, e.g., transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
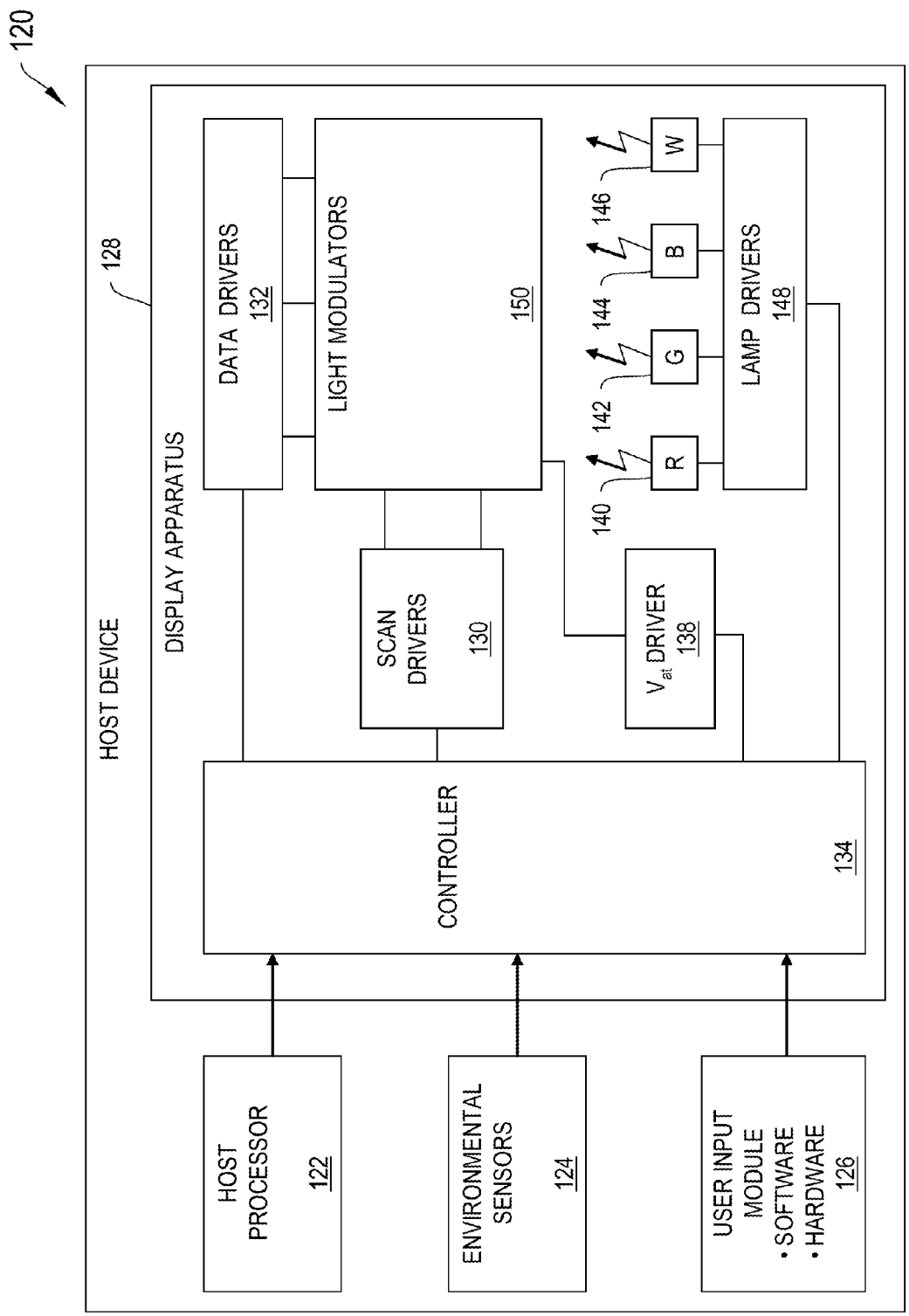
FIG. 1B shows a block diagram of an example host device.

FIG. 1B shows a block diagram of an example host device 120 (i.e., cell phone, smart phone, PDA, MP3 player, tablet, e-reader, netbook, notebook, etc.). The host device 120 includes a display apparatus 128, a host processor 122, environmental sensors 124, a user input module 126, and a power source.

The display apparatus 128 includes a plurality of scan drivers 130 (also referred to as "write enabling voltage sources"), a plurality of data drivers 132 (also referred to as "data voltage sources"), a controller 134, common drivers 138, lamps 140-146, lamp drivers 148 and an array 150 of display elements, such as the light modulators 102 shown in FIG. 1A. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the array 150 of display elements, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the "controller 134"). The controller sends data to the data drivers 132 in a mostly serial fashion, organized in predetermined sequences grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 114. In some other implementations, the common drivers 138, following commands from the controller 134, issue voltage pulses or signals to the array 150 of display elements, for instance global actuation pulses which are capable of driving and/or initiating simultaneous actuation of all display elements in multiple rows and columns of the array 150.

All of the drivers (e.g., scan drivers 130, data drivers 132 and common drivers 138) for different display functions are time-synchronized by the controller 134. Timing commands from the controller coordinate the illumination of red, green and blue and white lamps 140, 142, 144 and 146 respectively) via lamp drivers 148, the write-enabling and sequencing of specific rows within the array 150 of display elements, the output of voltages from the data drivers 132, and the output of voltages that provide for display element actuation. In some implementations, the lamps are light emitting diodes (LEDs).

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array 150 is synchronized with the illumination of the lamps 140, 142, 144 and 146 such that alternate image frames are illuminated with an alternating series of colors, such as red, green, and blue. The image frames for each respective color is referred to as a color subframe. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 134 forms an image by the method of time division gray scale, as previously described. In some other implementations, the display apparatus 100 can provide gray scale through the use of multiple shutters 108 per pixel.

In some implementations, the data for an image state 104 is loaded by the controller 134 to the display element array 150 by a sequential addressing of individual rows, also referred to as scan lines. For each row or scan line in the sequence, the scan driver 130 applies a write-enable voltage to the write enable interconnect 110 for that row of the array 150, and subsequently the data driver 132 supplies data voltages, corresponding to desired shutter states, for each column in the selected row. This process repeats until data has been loaded for all rows in the array 150. In some implementations, the sequence of selected rows for data loading is linear, proceeding from top to bottom in the array 150. In some other implementations, the sequence of selected rows is pseudo-randomized, in order to minimize visual artifacts. And in some other implementations the sequencing is organized by blocks, where, for a block, the data for only a certain fraction of the image state 104 is loaded to the array 150, for instance by addressing only every 5th row of the array 150 in sequence.

In some implementations, the process for loading image data to the array 150 is separated in time from the process of actuating the display elements in the array 150. In these implementations, the display element array 150 may include data memory elements for each display element in the array 150 and the control matrix may include a global actuation interconnect for carrying trigger signals, from common driver 138, to initiate simultaneous actuation of shutters 108 according to data stored in the memory elements.

In alternative implementations, the array 150 of display elements and the control matrix that controls the display elements may be arranged in configurations other than rectangular rows and columns. For example, the display elements can be arranged in hexagonal arrays or curvilinear rows and columns. In general, as used herein, the term scan-line shall refer to any plurality of display elements that share a write-enabling interconnect.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as "deeper color," "better contrast," "lower power," "increased brightness," "sports," "live action," or "animation." In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device 120. The environmental sensor module 124 receives data about the ambient environment, such as temperature and/or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2:
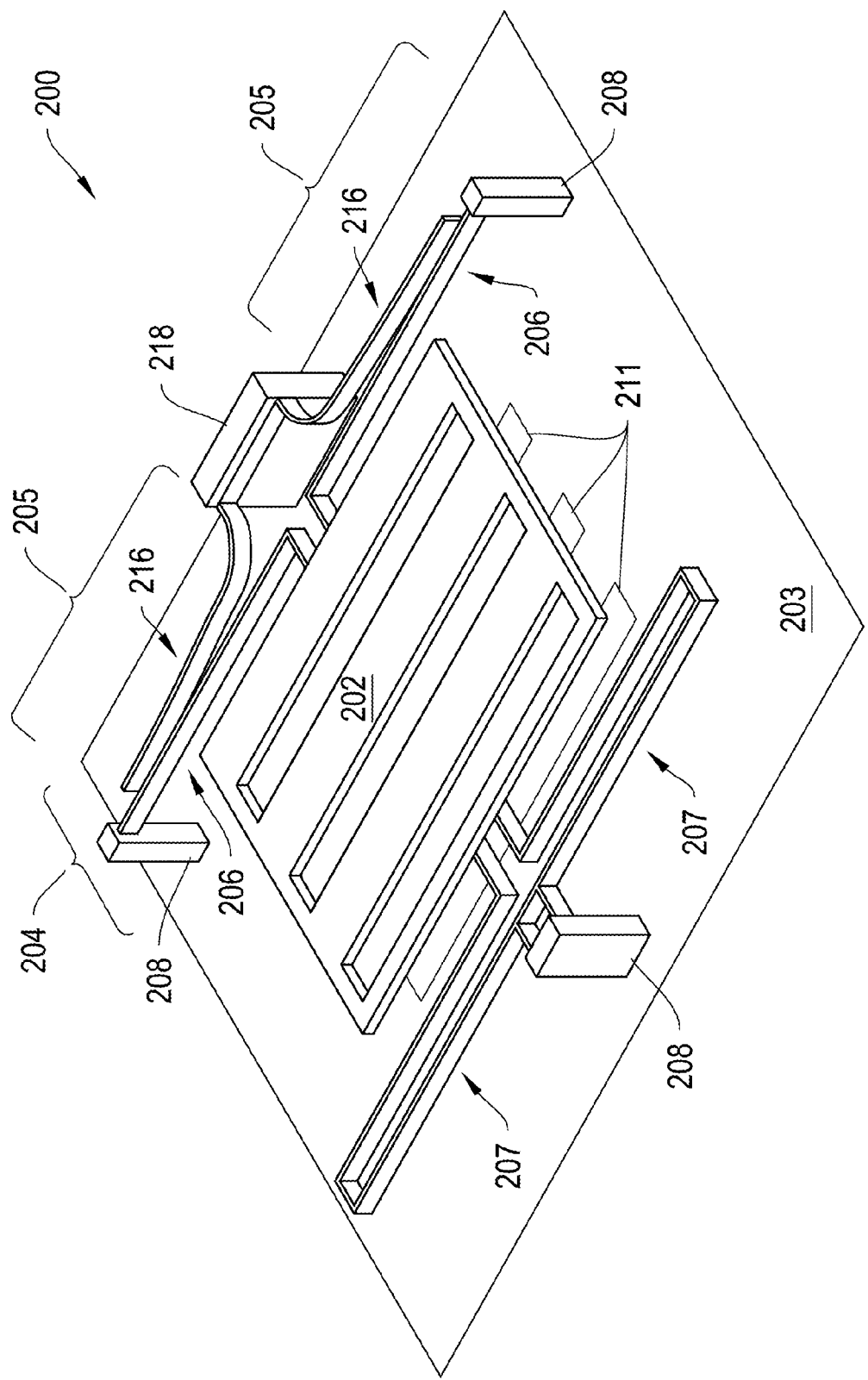
FIG. 2 shows a perspective view of an example shutter-based light modulator.

FIG. 2 shows a perspective view of an example shutter-based light modulator 200. The shutter-based light modulator 200 is suitable for incorporation into the direct-view MEMS-based display apparatus 100 of FIG. 1A. The light modulator 200 includes a shutter 202 coupled to an actuator 204. The actuator 204 can be formed from two separate compliant electrode beam actuators 205 (the "actuators 205"). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The surface 203 includes one or more aperture holes 211 for admitting the passage of light. The load anchors 208 physically connect the compliant load beams 206 and the shutter 202 to the surface 203 and electrically connect the load beams 206 to a bias voltage, in some instances, ground.

If the substrate is opaque, such as silicon, then aperture holes 211 are formed in the substrate by etching an array of holes through the substrate. If the substrate is transparent, such as glass or plastic, then the aperture holes 211 are formed in a layer of light-blocking material deposited on the substrate. The aperture holes 211 can be generally circular, elliptical, polygonal, serpentine, or irregular in shape.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely toward the drive anchor 218. The compliant members 206 act as springs, such that when the voltage across the beams 206 and 216 potential is removed, the load beams 206 push the shutter 202 back into its initial position, releasing the stress stored in the load beams 206.

A light modulator, such as the light modulator 200, incorporates a passive restoring force, such as a spring, for returning a shutter to its rest position after voltages have been removed. Other shutter assemblies can incorporate a dual set of "open" and "closed" actuators and separate sets of "open" and "closed" electrodes for moving the shutter into either an open or a closed state.

There are a variety of methods by which an array of shutters and apertures can be controlled via a control matrix to produce images, in many cases moving images, with appropriate luminance levels. In some cases, control is accomplished by means of a passive matrix array of row and column interconnects connected to driver circuits on the periphery of the display. In other cases, it is appropriate to include switching and/or data storage elements within each pixel of the array (the so-called active matrix) to improve the speed, the luminance level and/or the power dissipation performance of the display.

Figure 3A:
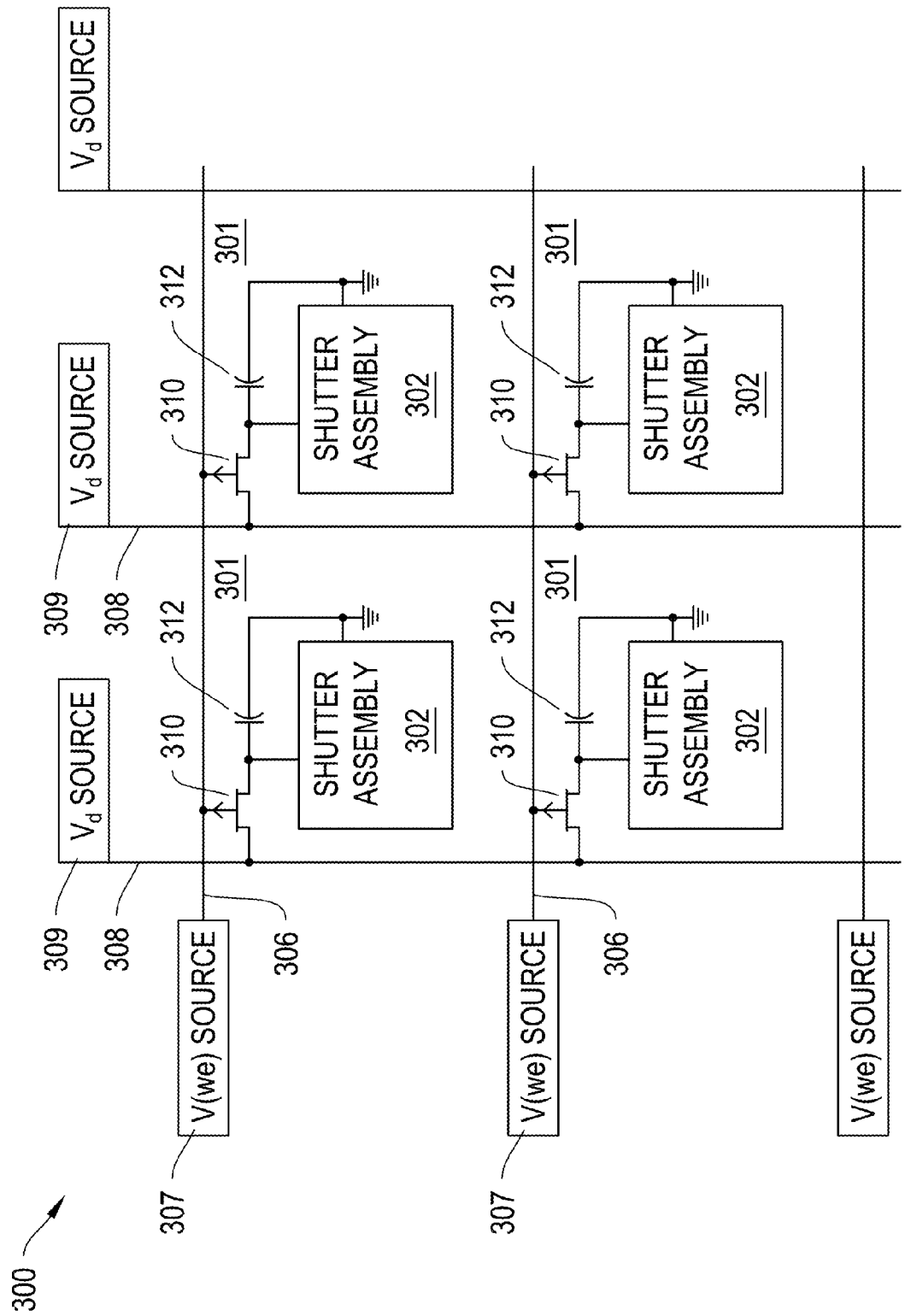
FIG. 3A shows a schematic diagram of an example control matrix.
Figure 3B:
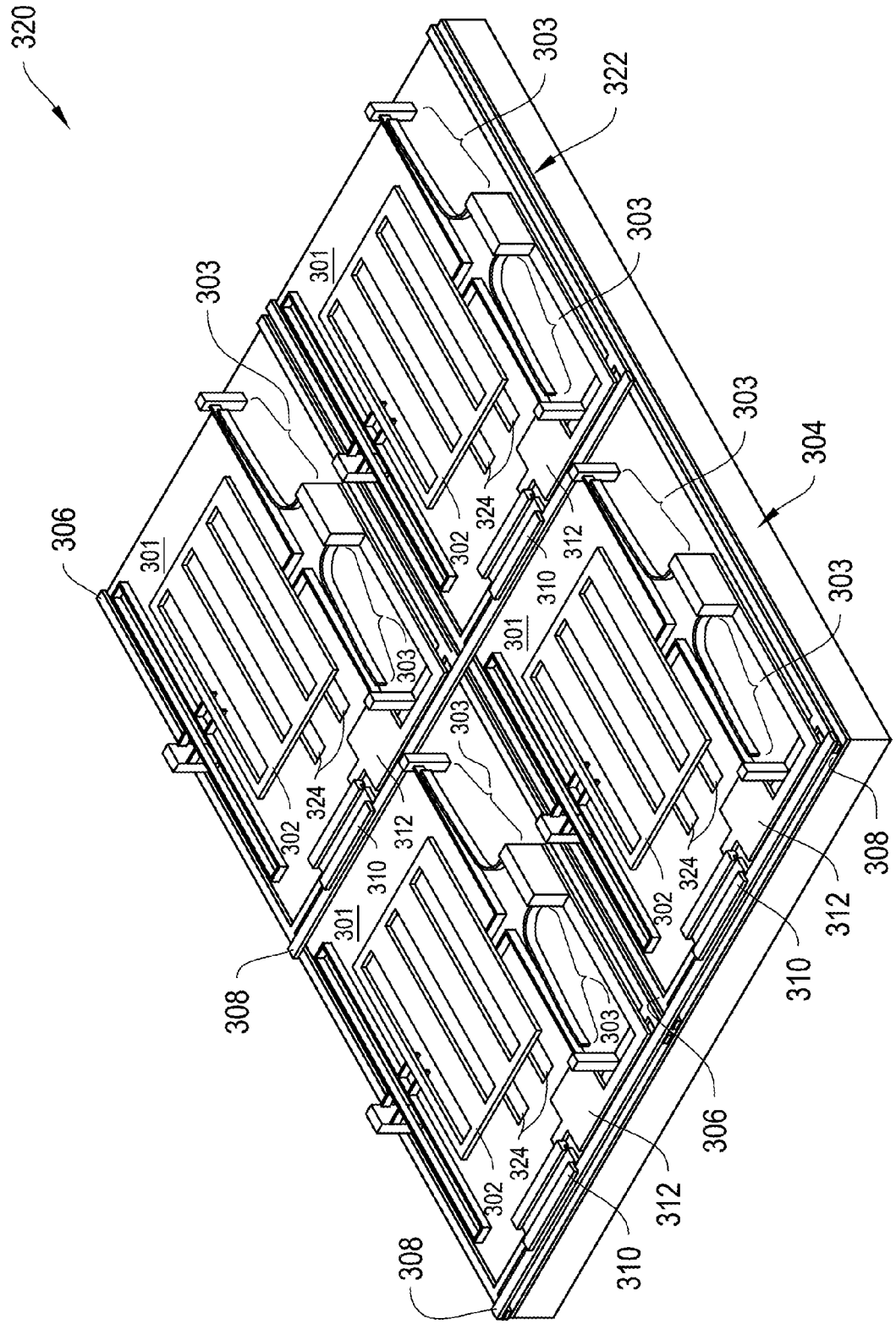
FIG. 3B shows a perspective view of an example array of shutter-based light modulators connected to the control matrix of FIG. 3A.

FIG. 3A shows a schematic diagram of an example control matrix 300. The control matrix 300 is suitable for controlling the light modulators incorporated into the MEMS-based display apparatus 100 of FIG. 1A. FIG. 3B shows a perspective view of an example array 320 of shutter-based light modulators connected to the control matrix 300 of FIG. 3A. The control matrix 300 may address an array of pixels 320 (the "array 320"). Each pixel 301 can include an elastic shutter assembly 302, such as the shutter assembly 200 of FIG. 2, controlled by an actuator 303. Each pixel also can include an aperture layer 322 that includes apertures 324.

The control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source 309 ("Vd source") to the pixels 301 in a corresponding column of pixels. In the control matrix 300, the Vd source 309 provides the majority of the energy to be used for actuation of the shutter assemblies 302. Thus, the data voltage source, Vd source 309, also serves as an actuation voltage source.

Referring to FIGS. 3A and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and/or metal-insulator-metal sandwich type switching elements.

In operation, to form an image, the control matrix 300 write-enables each row in the array 320 in a sequence by applying Vwe to each scan-line interconnect 306 in turn. For a write-enabled row, the application of Vwe to the gates of the transistors 310 of the pixels 301 in the row allows the flow of current through the data interconnects 308 through the transistors 310 to apply a potential to the actuator 303 of the shutter assembly 302. While the row is write-enabled, data voltages Vd are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed Vat (the actuation threshold voltage). In response to the application of Vat to a data interconnect 308, the actuator 303 in the corresponding shutter assembly actuates, opening the shutter in that shutter assembly 302. The voltage applied to the data interconnect 308 remains stored in the capacitor 312 of the pixel 301 even after the control matrix 300 ceases to apply Vwe to a row. Therefore, the voltage Vwe does not have to wait and hold on a row for times long enough for the shutter assembly 302 to actuate; such actuation can proceed after the write-enabling voltage has been removed from the row. The capacitors 312 also function as memory elements within the array 320, storing actuation instructions for the illumination of an image frame.

The pixels 301 as well as the control matrix 300 of the array 320 are formed on a substrate 304. The array 320 includes an aperture layer 322, disposed on the substrate 304, which includes a set of apertures 324 for respective pixels 301 in the array 320. The apertures 324 are aligned with the shutter assemblies 302 in each pixel. In some implementations, the substrate 304 is made of a transparent material, such as glass or plastic. In some other implementations, the substrate 304 is made of an opaque material, but in which holes are etched to form the apertures 324.

The shutter assembly 302 together with the actuator 303 can be made bi-stable. That is, the shutters can exist in at least two equilibrium positions (e.g., open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 also can be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as the spring 207 in the shutter-based light modulator 200 depicted in FIG. 2, or the opposing force may be exerted by an opposing actuator, such as an "open" or "closed" actuator.

The light modulator array 320 is depicted as having a single MEMS light modulator per pixel. Other implementations are possible in which multiple MEMS light modulators are provided in each pixel, thereby providing the possibility of more than just binary 'on' or 'off' optical states in each pixel. Certain forms of coded area division gray scale are possible where multiple MEMS light modulators in the pixel are provided, and where apertures 324, which are associated with each of the light modulators, have unequal areas.

Figure 4A:
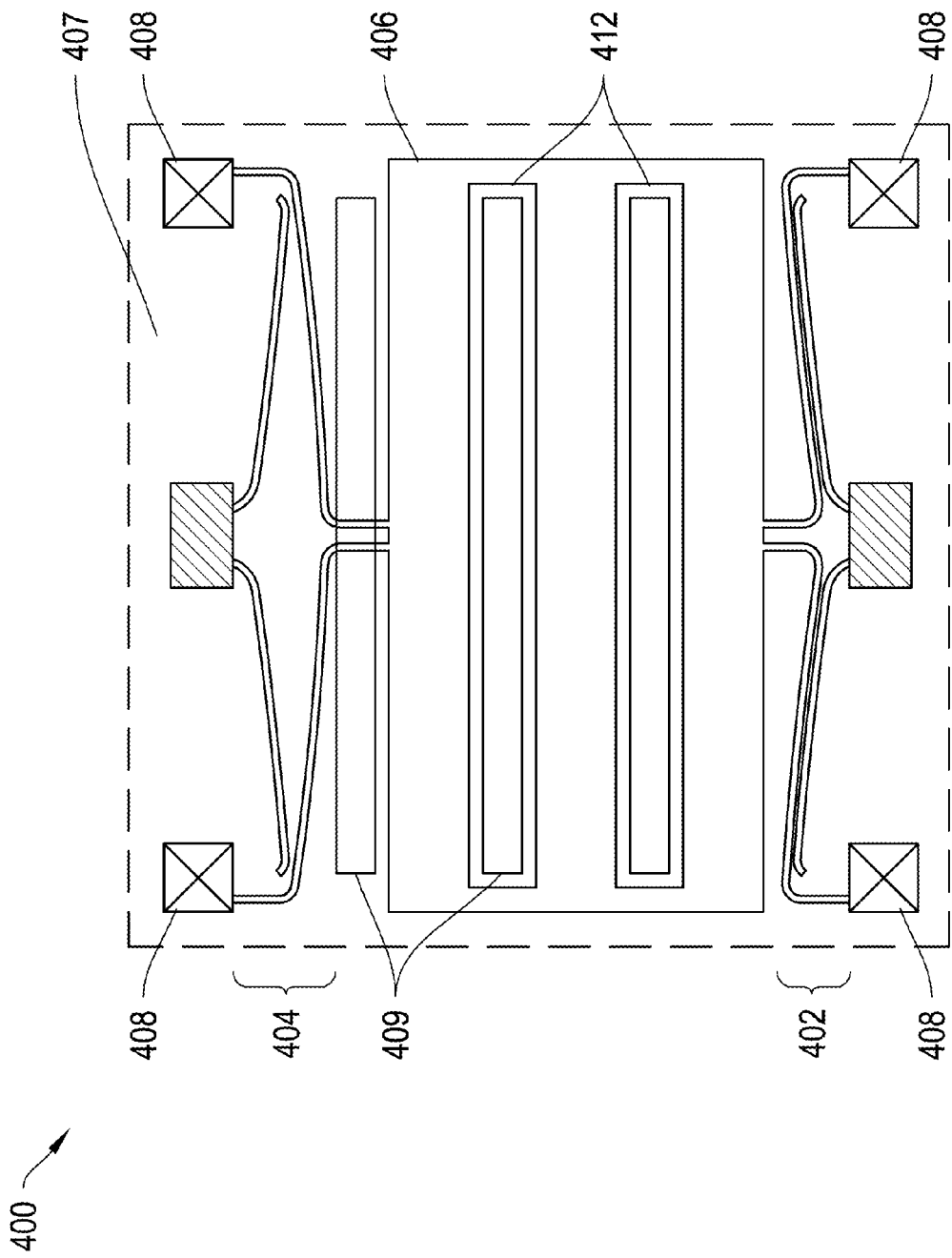
FIG. 4A and FIG. 4B show views of an example dual actuator shutter assembly.
Figure 4B:
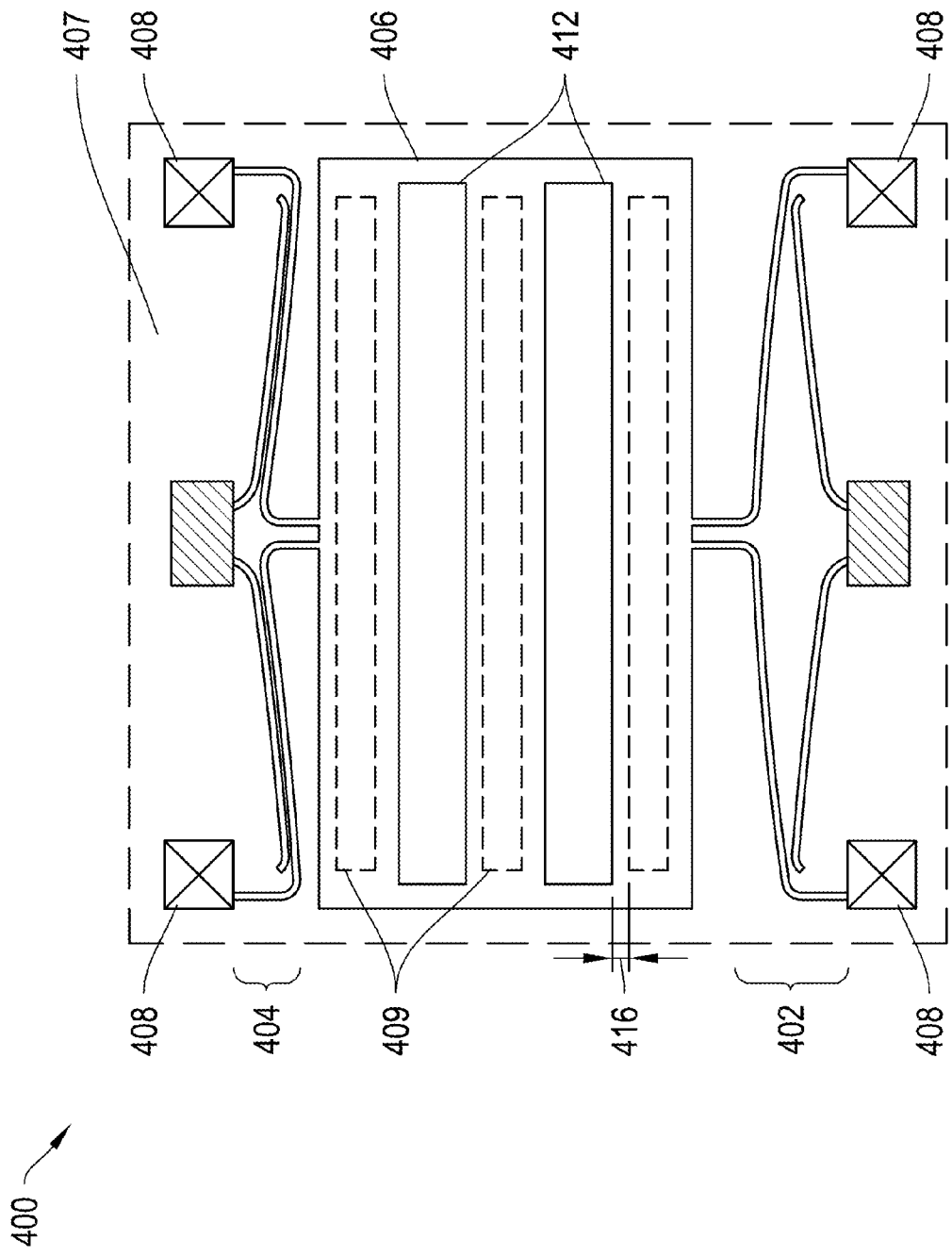

FIGS. 4A and 4B show views of an example dual actuator shutter assembly 400. The dual actuator shutter assembly 400, as depicted in FIG. 4A, is in an open state. FIG. 4B shows the dual actuator shutter assembly 400 in a closed state. In contrast to the shutter assembly 200, the shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter-close actuator 404, serves to close the shutter 406. Both of the actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially to a plane parallel to the substrate. By analogy to the control matrix 300 of FIG. 3A, a control matrix suitable for use with the shutter assembly 400 might include one transistor and one capacitor for each of the opposing shutter-open and shutter-close actuators 402 and 404.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of the shutter apertures 412 coincide with the centerlines of two of the aperture layer apertures 409. In FIG. 4B, the shutter assembly 400 has been moved to the closed state and, as such, the shutter-open actuator 402 is in its relaxed position, the shutter-close actuator 404 has been actuated, and the light blocking portions of the shutter 406 are now in position to block transmission of light through the apertures 409 (depicted as dotted lines).

Each aperture has at least one edge around its periphery. For example, the rectangular apertures 409 have four edges. In alternative implementations in which circular, elliptical, oval, or other curved apertures are formed in the aperture layer 407, each aperture may have only a single edge. In some other implementations, the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, it is preferable that the light blocking portions of the shutter 406 overlap the apertures 409. FIG. 4B shows a predefined overlap 416 between the edge of light blocking portions in the shutter 406 and one edge of the aperture 409 formed in the aperture layer 407.

The electrostatic actuators 402 and 404 are designed so that their voltage-displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage Vm.

Figure 5:
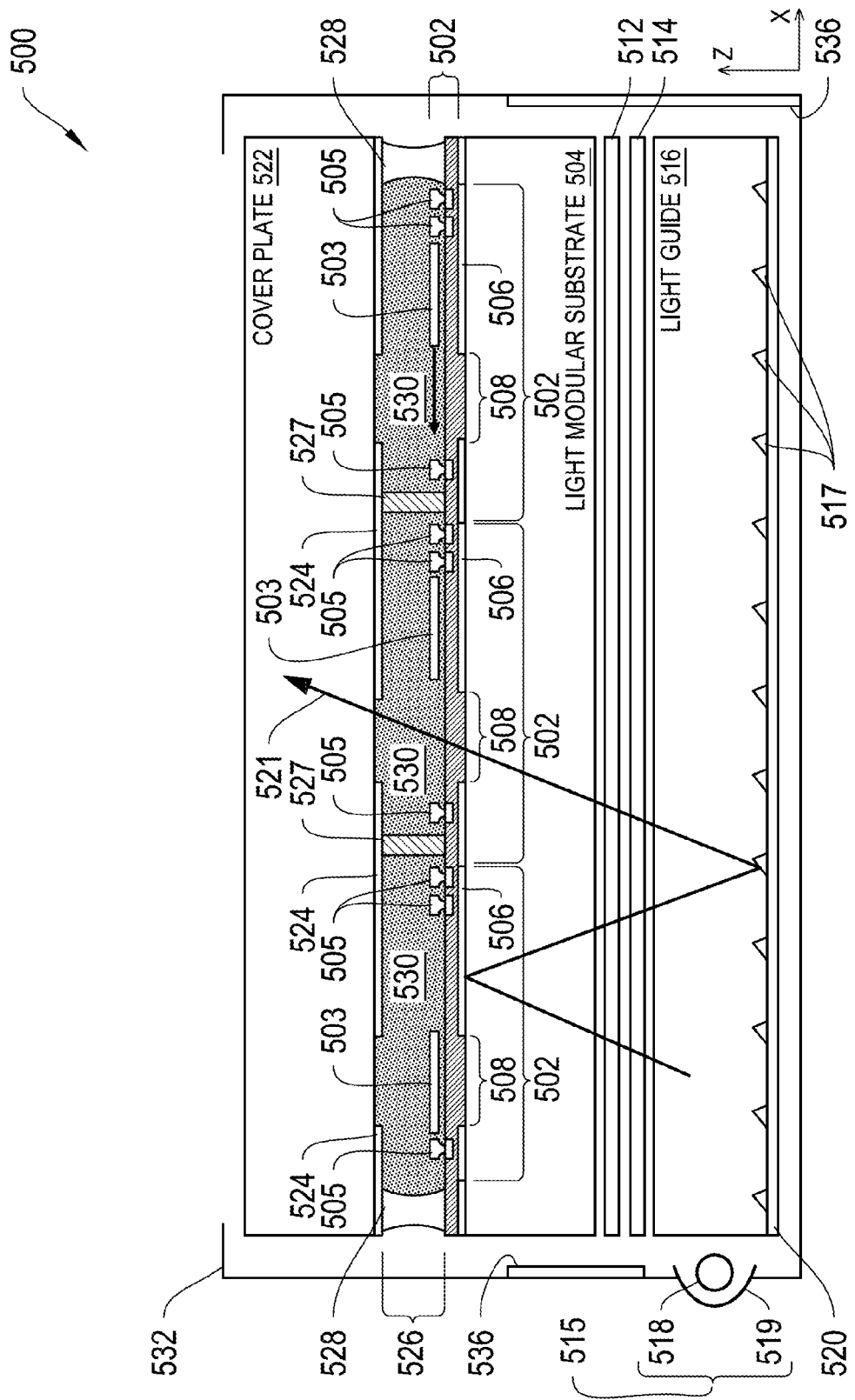
FIG. 5 shows a cross sectional view of an example display apparatus incorporating shutter-based light modulators.

FIG. 5 shows a cross sectional view of an example display apparatus 500 incorporating shutter-based light modulators (shutter assemblies) 502. Each shutter assembly 502 incorporates a shutter 503 and an anchor 505. Not shown are the compliant beam actuators which, when connected between the anchors 505 and the shutters 503, help to suspend the shutters 503 a short distance above the surface. The shutter assemblies 502 are disposed on a transparent substrate 504, such a substrate made of plastic or glass. A rear-facing reflective layer, reflective film 506, disposed on the substrate 504 defines a plurality of surface apertures 508 located beneath the closed positions of the shutters 503 of the shutter assemblies 502. The reflective film 506 reflects light not passing through the surface apertures 508 back towards the rear of the display apparatus 500. The reflective aperture layer 506 can be a fine-grained metal film without inclusions formed in thin film fashion by a number of vapor deposition techniques including sputtering, evaporation, ion plating, laser ablation, or chemical vapor deposition (CVD). In some other implementations, the rear-facing reflective layer 506 can be formed from a mirror, such as a dielectric mirror. A dielectric mirror can be fabricated as a stack of dielectric thin films which alternate between materials of high and low refractive index. The vertical gap which separates the shutters 503 from the reflective film 506, within which the shutter is free to move, is in the range of 0.5 to 10 microns. The magnitude of the vertical gap is preferably less than the lateral overlap between the edge of shutters 503 and the edge of apertures 508 in the closed state, such as the overlap 416 depicted in FIG. 4B.

The display apparatus 500 includes an optional diffuser 512 and/or an optional brightness enhancing film 514 which separate the substrate 504 from a planar light guide 516. The light guide 516 includes a transparent, i.e., glass or plastic material. The light guide 516 is illuminated by one or more light sources 518, forming a backlight 515. The light sources 518 can be, for example, and without limitation, incandescent lamps, fluorescent lamps, lasers or light emitting diodes (LEDs). A reflector 519 helps direct light from lamp 518 towards the light guide 516. A front-facing reflective film 520 is disposed behind the light guide 516, reflecting light towards the shutter assemblies 502. Light rays such as ray 521 from the backlight that do not pass through one of the shutter assemblies 502 will be returned to the backlight 515 and reflected again from the film 520. In this fashion light that fails to leave the display apparatus 500 to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the lamps 518 towards the apertures 508 and hence toward the front of the display. The light redirectors 517 can be molded into the plastic body of light guide 516 with shapes that can be alternately triangular, trapezoidal, or curved in cross section. The density of the prisms 517 generally increases with distance from the lamp 518.

In some implementations, the aperture layer 506 can be made of a light absorbing material, and in alternate implementations the surfaces of shutter 503 can be coated with either a light absorbing or a light reflecting material. In some other implementations, the aperture layer 506 can be deposited directly on the surface of the light guide 516. In some implementations, the aperture layer 506 need not be disposed on the same substrate as the shutters 503 and anchors 505 (such as in the MEMS-down configuration described below).

In some implementations, the light sources 518 can include lamps of different colors, for instance, the colors red, green and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps, or red, green, blue and yellow lamps. In some other implementations, the light source 518 may include cyan, magenta, yellow and white lamps, red, green, blue and white lamps. In some other implementations, additional lamps may be included in the light source 518. For example, if using five colors, the light source 518 may include red, green, blue, cyan and yellow lamps. In some other implementations, the light source 518 may include white, orange, blue, purple and green lamps or white, blue, yellow, red and cyan lamps. If using six colors, the light source 518 may include red, green, blue, cyan, magenta and yellow lamps or white, cyan, magenta, yellow, orange and green lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a predetermined distance away from the shutter assemblies 502 forming a gap 526. The gap 526 is maintained by mechanical supports or spacers 527 and/or by an adhesive seal 528 attaching the cover plate 522 to the substrate 504.

The adhesive seal 528 seals in a fluid 530. The fluid 530 is engineered with viscosities preferably below about 10 centipoise and with relative dielectric constant preferably above about 2.0, and dielectric breakdown strengths above about 104 V/cm. The fluid 530 also can serve as a lubricant. In some implementations, the fluid 530 is a hydrophobic liquid with a high surface wetting capability. In alternate implementations, the fluid 530 has a refractive index that is either greater than or less than that of the substrate 504.

Displays that incorporate mechanical light modulators can include hundreds, thousands, or in some cases, millions of moving elements. In some devices, every movement of an element provides an opportunity for static friction to disable one or more of the elements. This movement is facilitated by immersing all the parts in a fluid (also referred to as fluid 530) and sealing the fluid (e.g., with an adhesive) within a fluid space or gap in a MEMS display cell. The fluid 530 is usually one with a low coefficient of friction, low viscosity, and minimal degradation effects over the long term. When the MEMS-based display assembly includes a liquid for the fluid 530, the liquid at least partially surrounds some of the moving parts of the MEMS-based light modulator. In some implementations, in order to reduce the actuation voltages, the liquid has a viscosity below 70 centipoise. In some other implementations, the liquid has a viscosity below 10 centipoise. Liquids with viscosities below 70 centipoise can include materials with low molecular weights: below 4000 grams/mole, or in some cases below 400 grams/mole. Fluids 530 that also may be suitable for such implementations include, without limitation, de-ionized water, methanol, ethanol and other alcohols, paraffins, olefins, ethers, silicone oils, fluorinated silicone oils, or other natural or synthetic solvents or lubricants. Useful fluids can be polydimethylsiloxanes (PDMS), such as hexamethyldisiloxane and octamethyltrisiloxane, or alkyl methyl siloxanes such as hexylpentamethyldisiloxane. Useful fluids can be alkanes, such as octane or decane. Useful fluids can be nitroalkanes, such as nitromethane. Useful fluids can be aromatic compounds, such as toluene or diethylbenzene. Useful fluids can be ketones, such as butanone or methyl isobutyl ketone. Useful fluids can be chlorocarbons, such as chlorobenzene. Useful fluids can be chlorofluorocarbons, such as dichlorofluoroethane or chlorotrifluoroethylene. Other fluids considered for these display assemblies include butyl acetate and dimethylformamide. Still other useful fluids for these displays include hydro fluoro ethers, perfluoropolyethers, hydro fluoro poly ethers, pentanol, and butanol. Example suitable hydro fluoro ethers include ethyl nonafluorobutyl ether and 2-trifluoromethyl-3-ethoxydodecafluorohexane.

A sheet metal or molded plastic assembly bracket 532 holds the cover plate 522, the substrate 504, the backlight and the other component parts together around the edges. The assembly bracket 532 is fastened with screws or indent tabs to add rigidity to the combined display apparatus 500. In some implementations, the light source 518 is molded in place by an epoxy potting compound. Reflectors 536 help return light escaping from the edges of the light guide 516 back into the light guide 516. Not depicted in FIG. 5 are electrical interconnects which provide control signals as well as power to the shutter assemblies 502 and the lamps 518.

The display apparatus 500 is referred to as the MEMS-up configuration, wherein the MEMS based light modulators are formed on a front surface of the substrate 504, i.e., the surface that faces toward the viewer. The shutter assemblies 502 are built directly on top of the reflective aperture layer 506. In an alternate implementation, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in the display apparatus 500 and is oriented such that the MEMS-based light modulators are positioned on the rear surface of the top substrate, i.e., the surface that faces away from the viewer and toward the light guide 516. The MEMS-based light modulators are thereby positioned directly opposite to and across a gap from the reflective aperture layer 506. The gap can be maintained by a series of spacer posts connecting the aperture plate and the substrate on which the MEMS modulators are formed. In some implementations, the spacers are disposed within or between each pixel in the array. The gap or distance that separates the MEMS light modulators from their corresponding apertures is preferably less than 10 microns, or a distance that is less than the overlap between shutters and apertures, such as overlap 416.

Figure 6A:
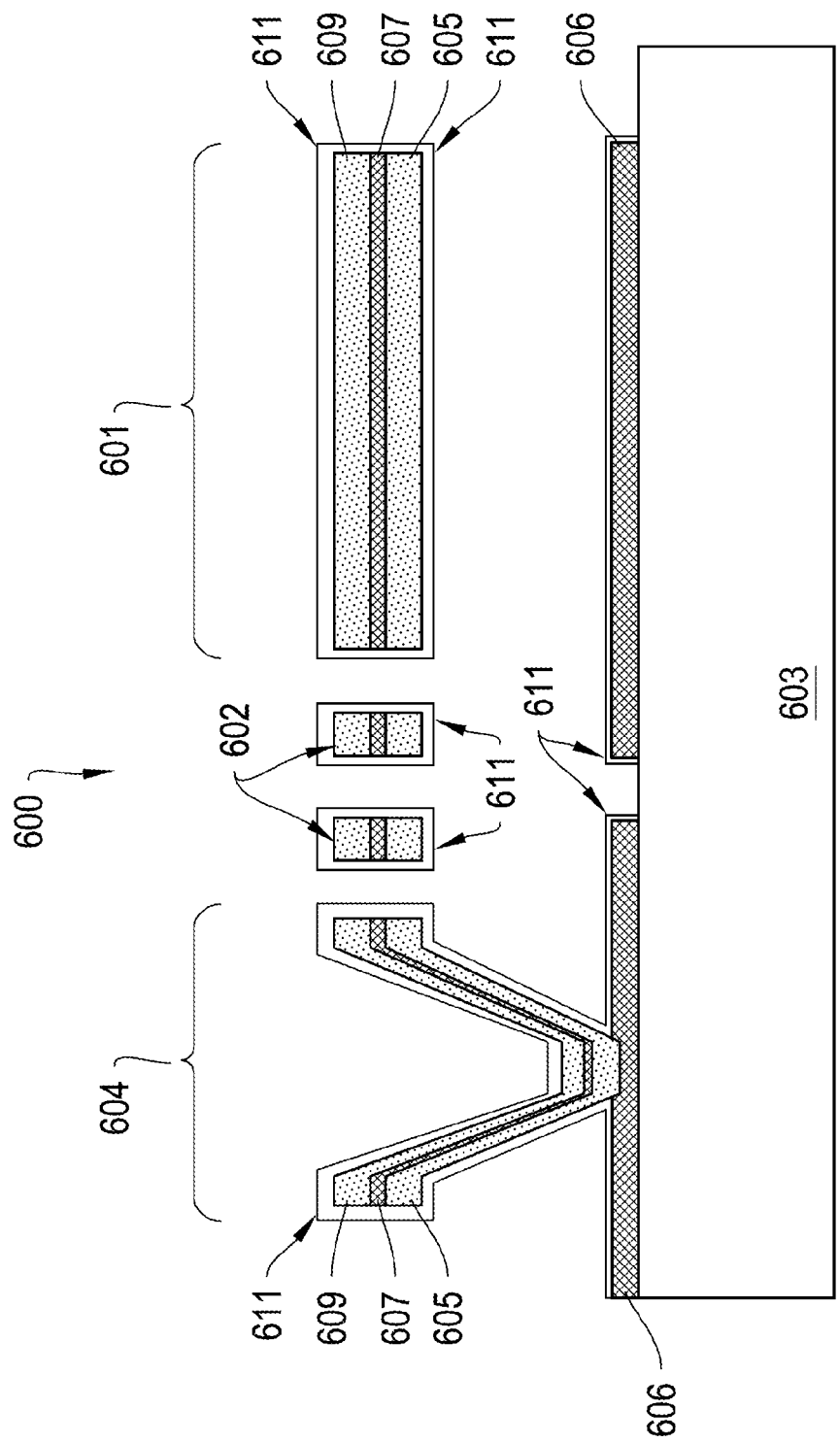
FIGS. 6A-6E show cross sectional views of stages of construction of an example composite shutter assembly.

FIGS. 6A-6E show cross sectional views of stages of construction of an example composite shutter assembly. FIG. 6A shows an example cross sectional diagram of a completed composite shutter assembly 600. The shutter assembly 600 includes a shutter 601, two compliant beams 602, and an anchor structure 604 built-up on a substrate 603 and an aperture layer 606. The elements of the composite shutter assembly 600 include a first mechanical layer 605, a conductor layer 607, a second mechanical layer 609, and an encapsulating dielectric 611. At least one of the mechanical layers 605 or 609 can be deposited to thicknesses in excess of 0.15 microns, as one or both of the mechanical layers 605 or 609 serves as the principal load bearing and mechanical actuation member for the shutter assembly 600, though in some implementations, the mechanical layers 605 and 609 may be thinner. Candidate materials for the mechanical layers 605 and 609 include, without limitation, metals such as aluminum (Al), copper (Cu), nickel (Ni), chromium (Cr), molybdenum (Mo), titanium (Ti), tantalum (Ta), niobium (Nb), neodymium (Nd), or alloys thereof; dielectric materials such as aluminum oxide (Al2O3), silicon oxide (SiO2), tantalum pentoxide (Ta2O5), or silicon nitride (Si3N4); or semiconducting materials such as diamond-like carbon, silicon (Si), germanium (Ge), gallium arsenide (GaAs), cadmium telluride (CdTe) or alloys thereof. At least one of the layers, such as the conductor layer 607, should be electrically conducting so as to carry charge on to and off of the actuation elements. Candidate materials include, without limitation, Al, Cu, Ni, Cr, Mo, Ti, Ta, Nb, Nd, or alloys thereof or semiconducting materials such as diamond-like carbon, Si, Ge, GaAs, CdTe or alloys thereof. In some implementations employing semiconductor layers, the semiconductors are doped with impurities such as phosphorus (P), arsenic (As), boron (B), or Al. FIG. 6A depicts a sandwich configuration for the composite in which the mechanical layers 605 and 609, having similar thicknesses and mechanical properties, are deposited on either side of the conductor layer 607. In some implementations, the sandwich structure helps to ensure that stresses remaining after deposition and/or stresses that are imposed by temperature variations will not act to cause bending, warping or other deformation of the shutter assembly 600.

In some implementations, the order of the layers in the composite shutter assembly 600 can be inverted, such that the outside of the shutter assembly 600 is formed from a conductor layer while the inside of the shutter assembly 600 is formed from a mechanical layer.

The shutter assembly 600 can include an encapsulating dielectric 611. In some implementations, dielectric coatings can be applied in conformal fashion, such that all exposed bottom, top, and side surfaces of the shutter 601, the anchor 604, and the beams 602 are uniformly coated. Such thin films can be grown by thermal oxidation and/or by conformal CVD of an insulator such as Al2O3, chromium (III) oxide (Cr2O3), titanium oxide (TiO2), hafnium oxide (HfO2), vanadium oxide (V2O5), niobium oxide (Nb2O5), Ta2O5, SiO2, or Si3N4, or by depositing similar materials via atomic layer deposition. The dielectric coating layer can be applied with thicknesses in the range of 10 nm to 1 micron. In some implementations, sputtering and evaporation can be used to deposit the dielectric coating onto sidewalls.

FIGS. 6B-6E show example cross sectional views of the results of certain intermediate manufacturing stages of an example process used to form the shutter assembly 600 depicted in FIG. 6A. In some implementations, the shutter assembly 600 is built on top of a pre-existing control matrix, such as an active matrix array of thin film transistors, such as the control matrices depicted in FIGS. 3A and 3B.

Figure 6B:
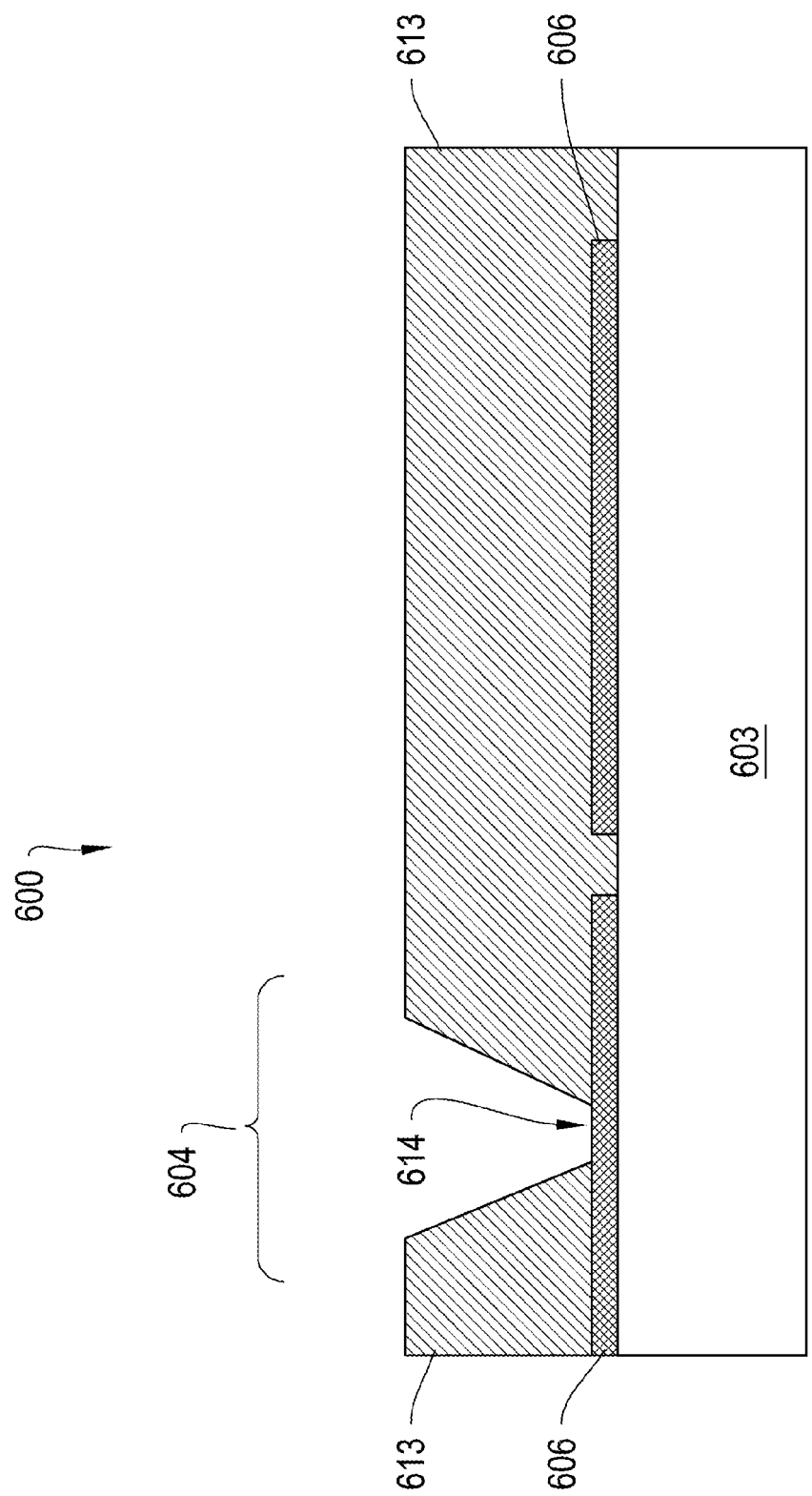

FIG. 6B shows a cross sectional view of the results of a first stage in an example process of forming the shutter assembly 600. As depicted in FIG. 6B, a sacrificial layer 613 is deposited and patterned. In some implementations, polyimide is used as a sacrificial layer material. Other candidate sacrificial layer materials include, without limitation, polymer materials such as polyamide, fluoropolymer, benzocyclobutene, polyphenylquinoxylene, parylene, or polynorbornene. These materials are chosen for their ability to planarize rough surfaces, maintain mechanical integrity at processing temperatures in excess of 250° C., and their ease of etch and/or thermal decomposition during removal. In other implementations, the sacrificial layer 613 is formed from a photoresist, such as polyvinyl acetate, polyvinyl ethylene, and phenolic or novolac resins. An alternate sacrificial layer material used in some implementations is SiO2, which can be removed preferentially as long as other electronic or structural layers are resistant to the hydrofluoric acid solutions used for its removal. One such suitable resistant material is Si3N4. Another alternate sacrificial layer material is Si, which can be removed preferentially as long as electronic or structural layers are resistant to the fluorine plasmas or xenon difluoride (XeF2) used for its removal, such as most metals and Si3N4. Yet another alternate sacrificial layer material is Al, which can be removed preferentially as long as other electronic or structural layers are resistant to strong base solutions, such as concentrated sodium hydroxide (NaOH) solutions. Suitable materials include, for example, Cr, Ni, Mo, Ta and Si. Still another alternate sacrificial layer material is Cu, which can be removed preferentially as long as other electronic or structural layers are resistant to nitric or sulfuric acid solutions. Such materials include, for example, Cr, Ni, and Si.

Next the sacrificial layer 613 is patterned to expose holes or vias at the anchor regions 604. In implementations employing polyimide or other non-photoactive materials as the sacrificial layer material, the sacrificial layer material can be formulated to include photoactive agents, allowing regions exposed through a UV photomask to be preferentially removed in a developer solution. Sacrificial layers formed from other materials can be patterned by coating the sacrificial layer 613 in an additional layer of photoresist, photopatterning the photoresist, and finally using the photoresist as an etching mask. The sacrificial layer 613 alternatively can be patterned by coating the sacrificial layer 613 with a hard mask, which can be a thin layer of SiO2 or a metal such as Cr. A photopattern is then transferred to the hard mask by way of photoresist and wet chemical etching. The pattern developed in the hard mask can be resistant to dry chemical, anisotropic, or plasma etching—techniques which can be used to impart deep and narrow anchor holes into the sacrificial layer 613.

After the anchor regions 604 have been opened in the sacrificial layer 613, the exposed and underlying conducting surface 614 can be etched, either chemically or via the sputtering effects of a plasma, to remove any surface oxide layers. Such a contact etching stage can improve the ohmic contact between the underlying conducting surface 614 and the shutter material. After patterning of the sacrificial layer 613, any photoresist layers or hard masks can be removed through use of either solvent cleaning or acid etching.

Figure 6C:
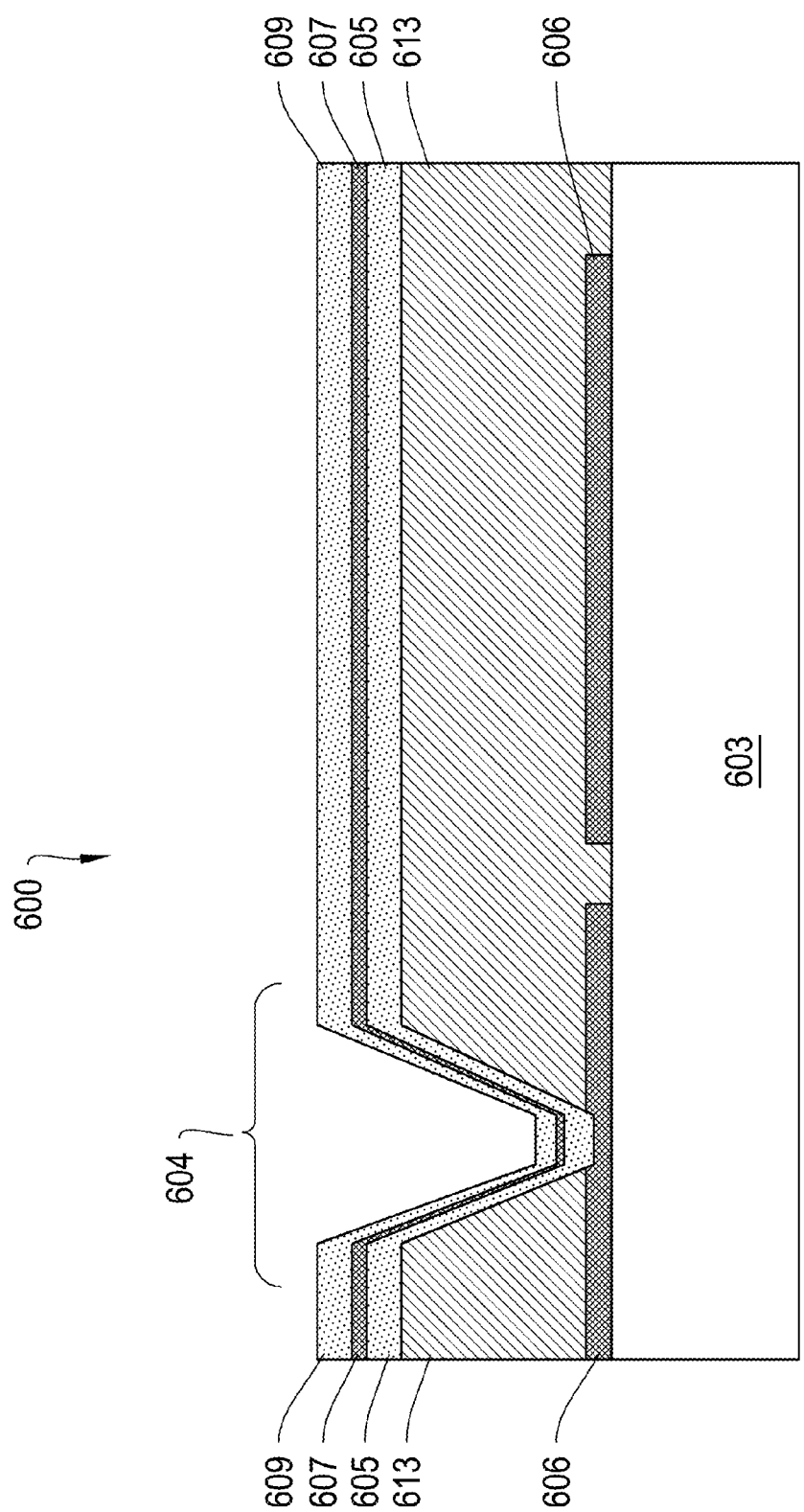

Next, in the process for building the shutter assembly 600, as depicted in FIG. 6C, the shutter materials are deposited. The shutter assembly 600 is composed of multiple thin films: the first mechanical layer 605, the conductor layer 607 and the second mechanical layer 609. In some implementations, the first mechanical layer 605 is an amorphous silicon (a-Si) layer, the conductor layer 607 is Al and the second mechanical layer 609 is a-Si. The first mechanical layer 605, the conductor layer 607, and the second mechanical layer 609 are deposited at a temperature which is below that at which physical degradation occurs for the sacrificial layer 613. For instance, polyimide decomposes at temperatures above about 400° C. Therefore, in some implementations, the first mechanical layer 605, the conductor layer 607 and the second mechanical layer 609 are deposited at temperatures below about 400° C., allowing usage of polyimide as a sacrificial layer material. In some implementations, hydrogenated amorphous silicon (a-Si:H) is a useful mechanical material for the first and second mechanical layers 605 and 609 since it can be grown to thicknesses in the range of about 0.15 to about 3 microns, in a relatively stress-free state, by way of plasma-enhanced chemical vapor deposition (PECVD) from silane gas at temperatures in the range of about 250 to about 350° C. In some of such implementations, phosphine gas (PH3) is used as a dopant so that the a-Si can be grown with resistivities below about 1 ohm-cm. In alternate implementations, a similar PECVD technique can be used for the deposition of Si3N4, silicon-rich Si3N4, or SiO2 materials as the first mechanical layer 605 or for the deposition of diamond-like carbon, Ge, SiGe, CdTe, or other semiconducting materials for the first mechanical layer 605. An advantage of the PECVD deposition technique is that the deposition can be quite conformal, that is, it can coat a variety of inclined surfaces or the inside surfaces of narrow via holes. Even if the anchor or via holes which are cut into the sacrificial layer material present nearly vertical sidewalls, the PECVD technique can provide a substantially continuous coating between the bottom and top horizontal surfaces of the anchor.

In addition to the PECVD technique, alternate suitable techniques available for the growth of the first and second mechanical layers 605 and 609 include RF or DC sputtering, metal-organic CVD, evaporation, electroplating or electroless plating.

For the conductor layer 607, in some implementations, a metal thin film, such as Al, is utilized. In some other implementations, alternative metals, such as Cu, Ni, Mo, or Ta can be chosen. The inclusion of such a conducting material serves two purposes. It reduces the overall sheet resistance of the shutter 601, and it helps to block the passage of visible light through the shutter 601, since a-Si, if less than about 2 microns thick, as may be used in some implementations of the shutter 601, can transmit visible light to some degree. The conducting material can be deposited either by sputtering or, in a more conformal fashion, by CVD techniques, electroplating, or electroless plating.

Figure 6D:
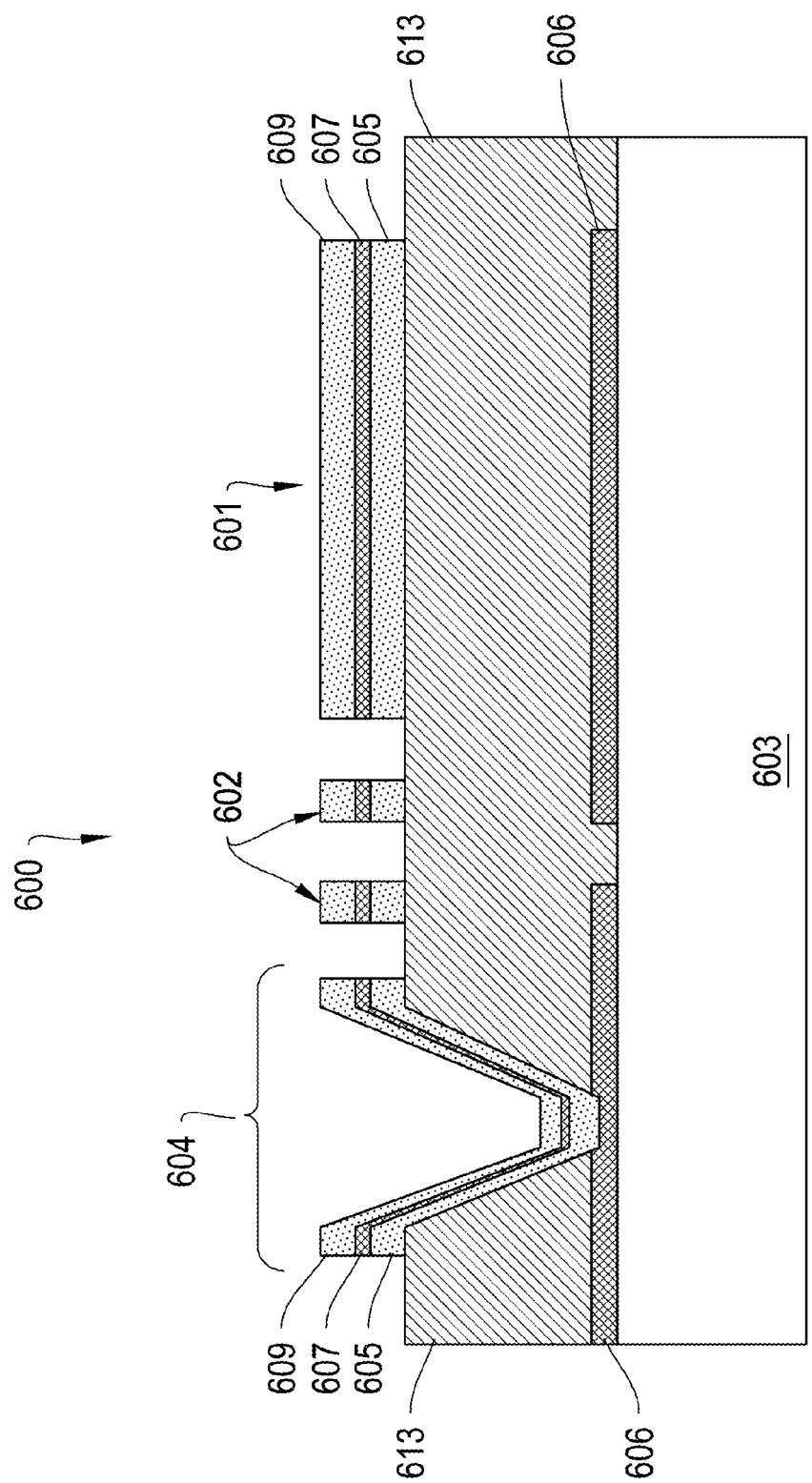

FIG. 6D shows the results of the next set of processing stages used in the formation of the shutter assembly 600. The first mechanical layer 605, the conductor layer 607, and the second mechanical layer 609 are photomasked and etched while the sacrificial layer 613 is still on the substrate 603. First, a photoresist material is applied, then exposed through a photomask, and then developed to form an etch mask. Amorphous silicon, Si3N4, and SiO2 can then be etched in fluorine-based plasma chemistries. SiO2 mechanical layers also can be etched using HF wet chemicals; and any metals in the conductor layer 607 can be etched with either wet chemicals or chlorine-based plasma chemistries.

The pattern shapes applied through the photomask can influence the mechanical properties, such as stiffness, compliance, and the voltage response in the actuator and shutter 601 of the shutter assembly 600. The shutter assembly 600 includes the compliant beams 602, shown in cross section. Each compliant beam 602 is shaped such that the width is less than the total height or thickness of the shutter material. In some implementations, the beam dimensional ratio is maintained at about 1.4:1 or greater, with the compliant beams 602 being taller or thicker than they are wide.

Figure 6E:
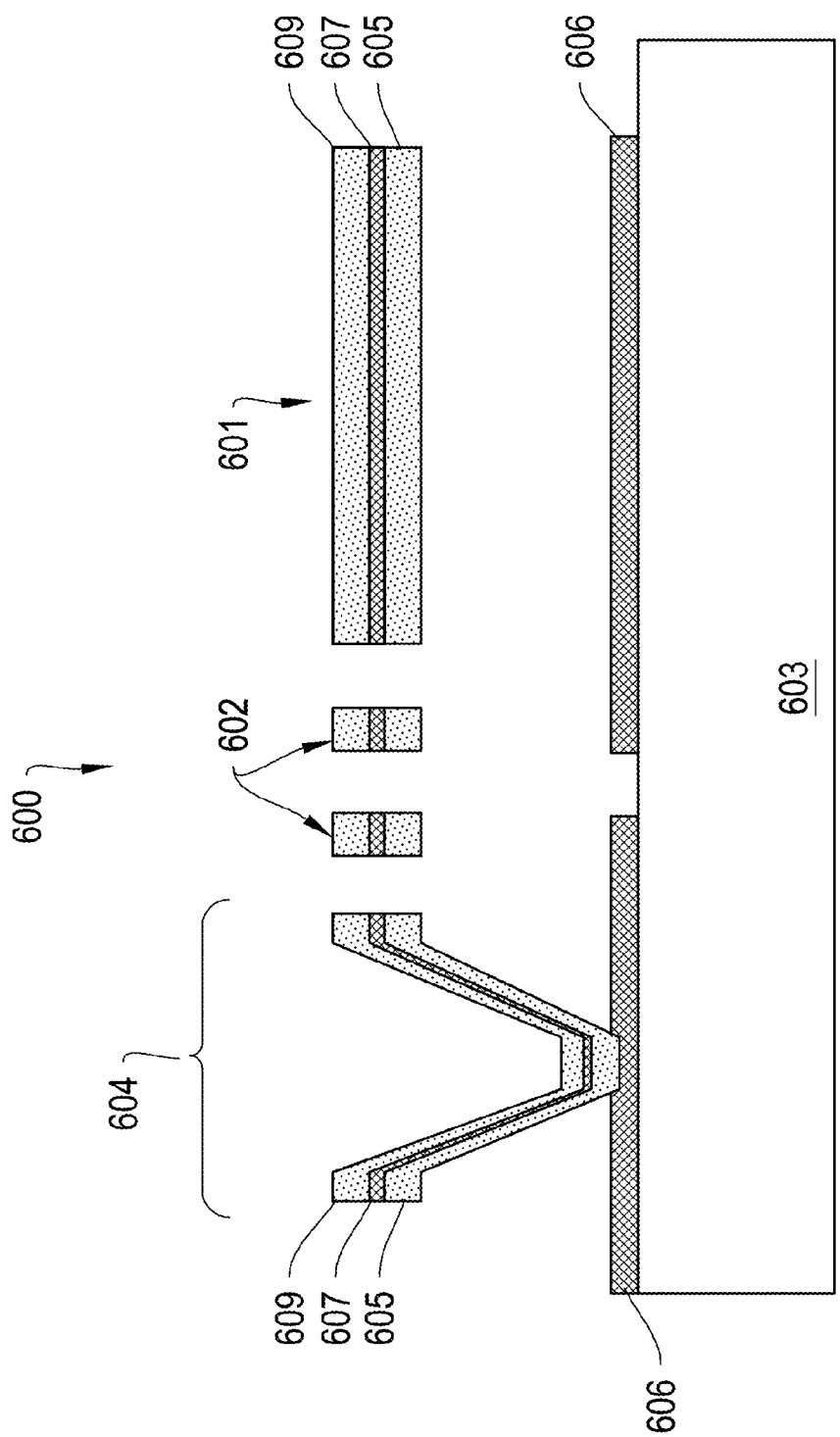

The results of subsequent stages of the example manufacturing process for building the shutter assembly 600 are depicted in FIG. 6E. The sacrificial layer 613 is removed, which frees-up all moving parts from the substrate 603, except at the anchor points. In some implementations, polyimide sacrificial materials are removed in an oxygen plasma. Other polymer materials used for the sacrificial layer 613 also can be removed in an oxygen plasma, or in some cases by thermal pyrolysis. Some sacrificial layer materials (such as SiO2) can be removed by wet chemical etching or by vapor phase etching.

In a final process, the results of which are depicted in FIG. 6A, the encapsulating dielectric 611 is deposited on all exposed surfaces of the shutter assembly 600. In some implementations, the encapsulating dielectric 611 can be applied in a conformal fashion, such that all bottom, top, and side surfaces of the shutter 601 and the beams 602 are uniformly coated using CVD. In some other implementations, only the top and side surfaces of the shutter 601 are coated. In some implementations, Al2O3 is used for the encapsulating dielectric 611 and is deposited by atomic layer deposition to thicknesses in the range of about 10 to about 100 nanometers.

Finally, anti-stiction coatings can be applied to the surfaces of the shutter 601 and the beams 602. These coatings prevent the unwanted stickiness or adhesion between two independent beams of an actuator. Suitable coatings include carbon films (both graphite and diamond-like) as well as fluoropolymers, and/or low vapor pressure lubricants, as well as chlorosilanes, hydrocarbon chlorosilanes, fluorocarbon chlorosilanes, such as methoxy-terminated silanes, perfluoronated, amino-silanes, siloxanes and carboxylic acid based monomers and species. These coatings can be applied by either exposure to a molecular vapor or by decomposition of precursor compounds by way of CVD. Anti-stiction coatings also can be created by the chemical alteration of shutter surfaces, such as by fluoridation, silanization, siloxidation, or hydrogenation of insulating surfaces.

One class of suitable actuators for use in MEMS-based shutter displays include compliant actuator beams for controlling shutter motion that is transverse to or in-the-plane of the display substrate. The voltage employed for the actuation of such shutter assemblies decreases as the actuator beams become more compliant. The control of actuated motion also improves if the beams are shaped such that in-plane motion is preferred or promoted with respect to out-of-plane motion. Thus, in some implementations, the compliant actuator beams have a rectangular cross section, such that the beams are taller or thicker than they are wide.

The stiffness of a long rectangular beam with respect to bending within a particular plane scales with the thinnest dimension of that beam in that plane to the third power. It is therefore advantageous to reduce the width of the compliant beams to reduce the actuation voltages for in-plane motion. When using conventional photolithography equipment to define and fabricate the shutter and actuator structures, however, the minimum width of the beams can be limited to the resolution of the optics. And although photolithography equipment has been developed for defining patterns in photoresist with narrow features, such equipment is expensive, and the areas over which patterning can be accomplished in a single exposure are limited. For economical photolithography over large panels of glass or other transparent substrates, the patterning resolution or minimum feature size is typically limited to several microns.

FIGS. 7A-7D show isometric views of stages of construction of an example shutter assembly 700 with narrow sidewall beams. This alternate process yields compliant actuator beams 718 and 720 and a compliant spring beam 716 (collectively referred to as "sidewall beams 716, 718 and 720"), which have a width well below the conventional lithography limits on large glass panels. In the process depicted in FIGS. 7A-7D, the compliant beams of shutter assembly 700 are formed as sidewall features on a mold made from a sacrificial material. The process is referred to as a sidewall beams process.

Figure 7A:
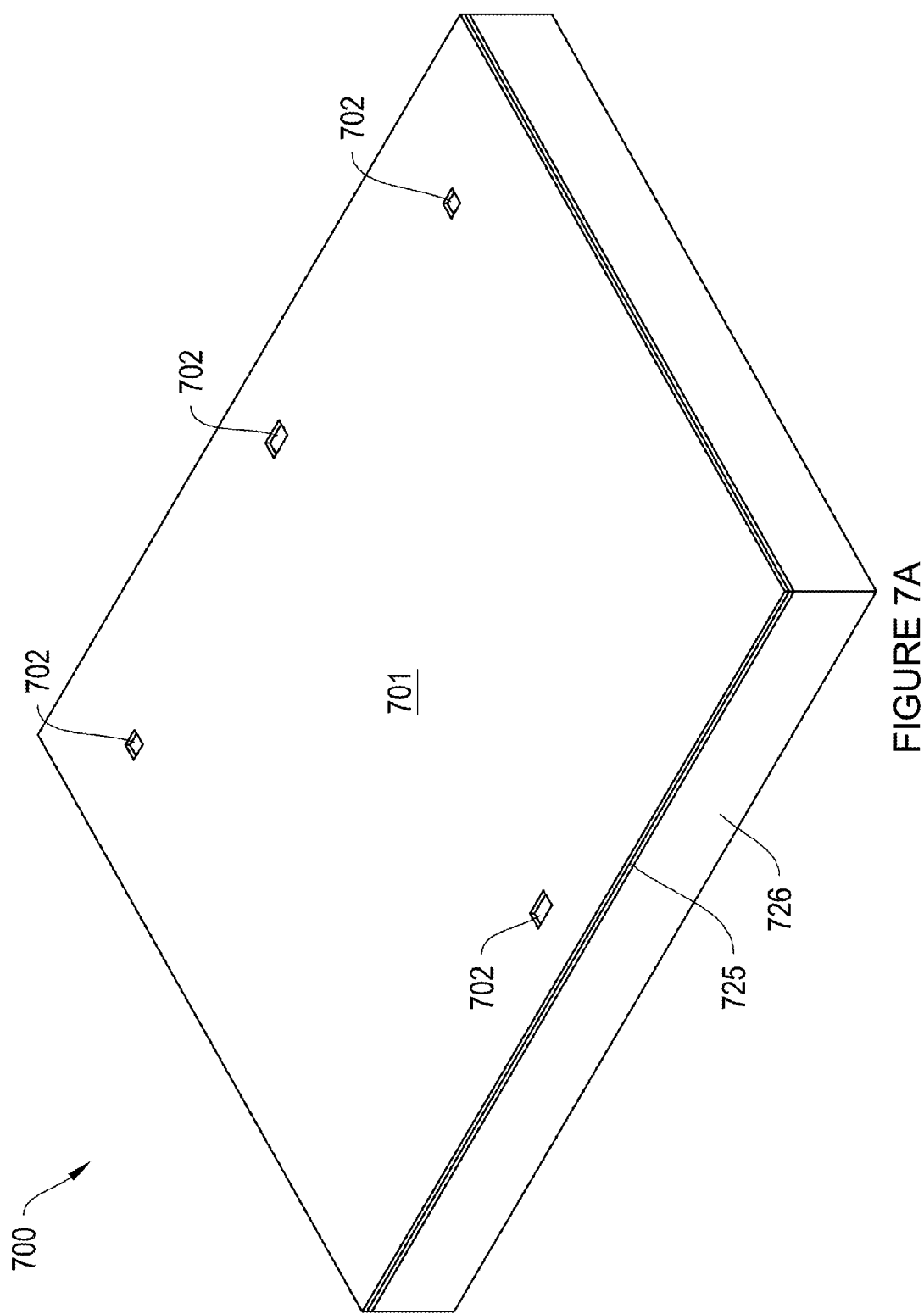
FIGS. 7A-7D show isometric views of stages of construction of an example shutter assembly with narrow sidewall beams.

The process of forming the shutter assembly 700 with the sidewall beams 716, 718 and 720 begins, as depicted in FIG. 7A, with the deposition and patterning of a first sacrificial material 701. The pattern defined in the first sacrificial material 701 creates openings or vias 702 within which anchors for the shutter assembly 700 eventually will be formed. The deposition and patterning of the first sacrificial material 701 is similar in concept, and uses similar materials and techniques, as those described for the deposition and patterning described in relation to FIGS. 6A-6E.

Figure 7B:
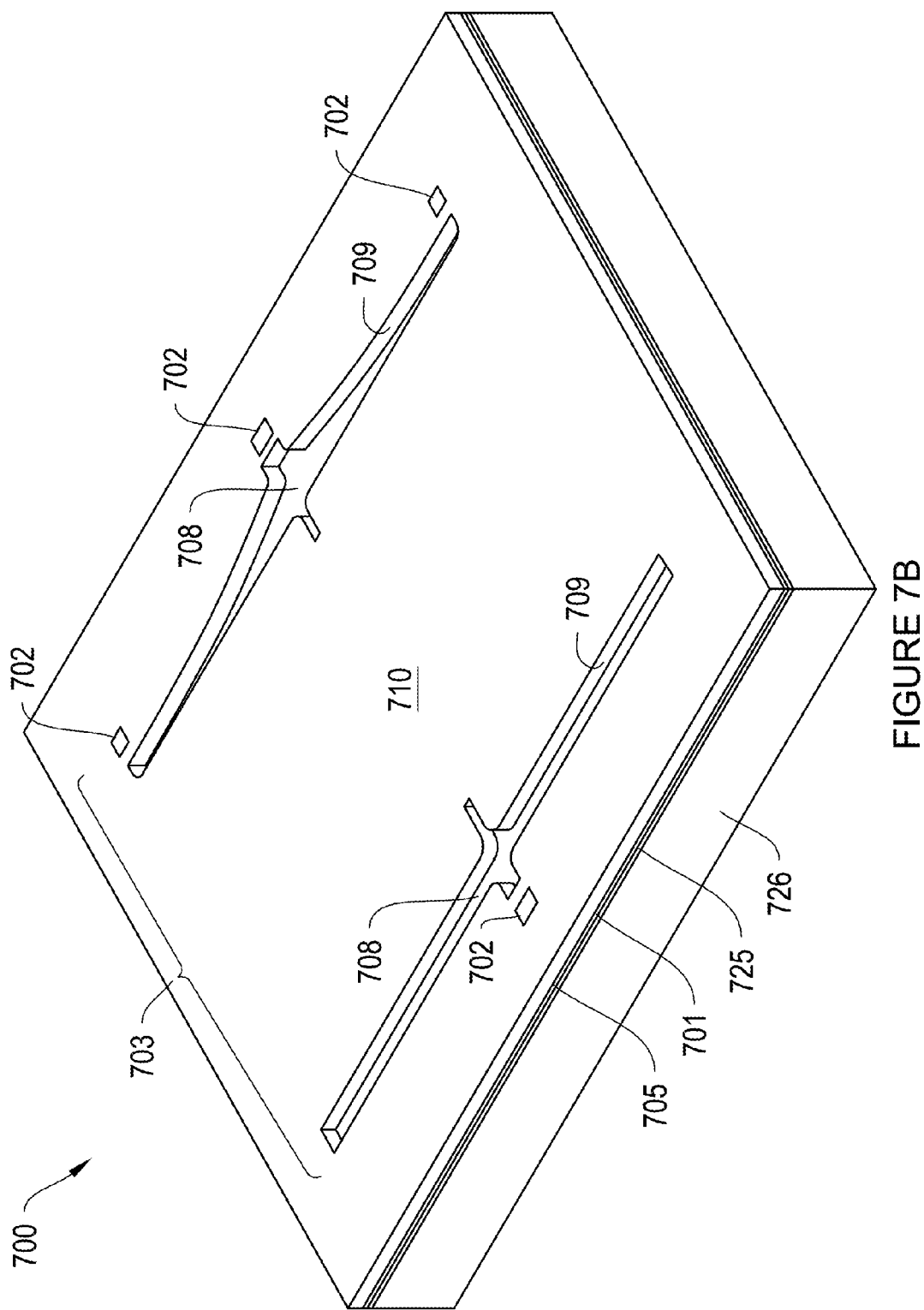

The process of forming the sidewall beams 716, 718 and 720 continues with the deposition and patterning of a second sacrificial material 705. FIG. 7B shows the shape of a mold 703 that is created after patterning of the second sacrificial material 705. The mold 703 also includes the first sacrificial material 701 with its previously defined vias 702. The mold 703 in FIG. 7B includes two distinct horizontal levels. The bottom horizontal level 708 of the mold 703 is established by the top surface of the first sacrificial layer 701 and is accessible in those areas where the second sacrificial material 705 has been etched away. The top horizontal level 710 of the mold 703 is established by the top surface of the second sacrificial material 705. The mold 703 depicted in FIG. 7B also includes substantially vertical sidewalls 709. Materials for use as the first and second sacrificial materials 701 and 705 are described above with respect to the sacrificial layer 613 of FIGS. 6A-6E.

Figure 7C:
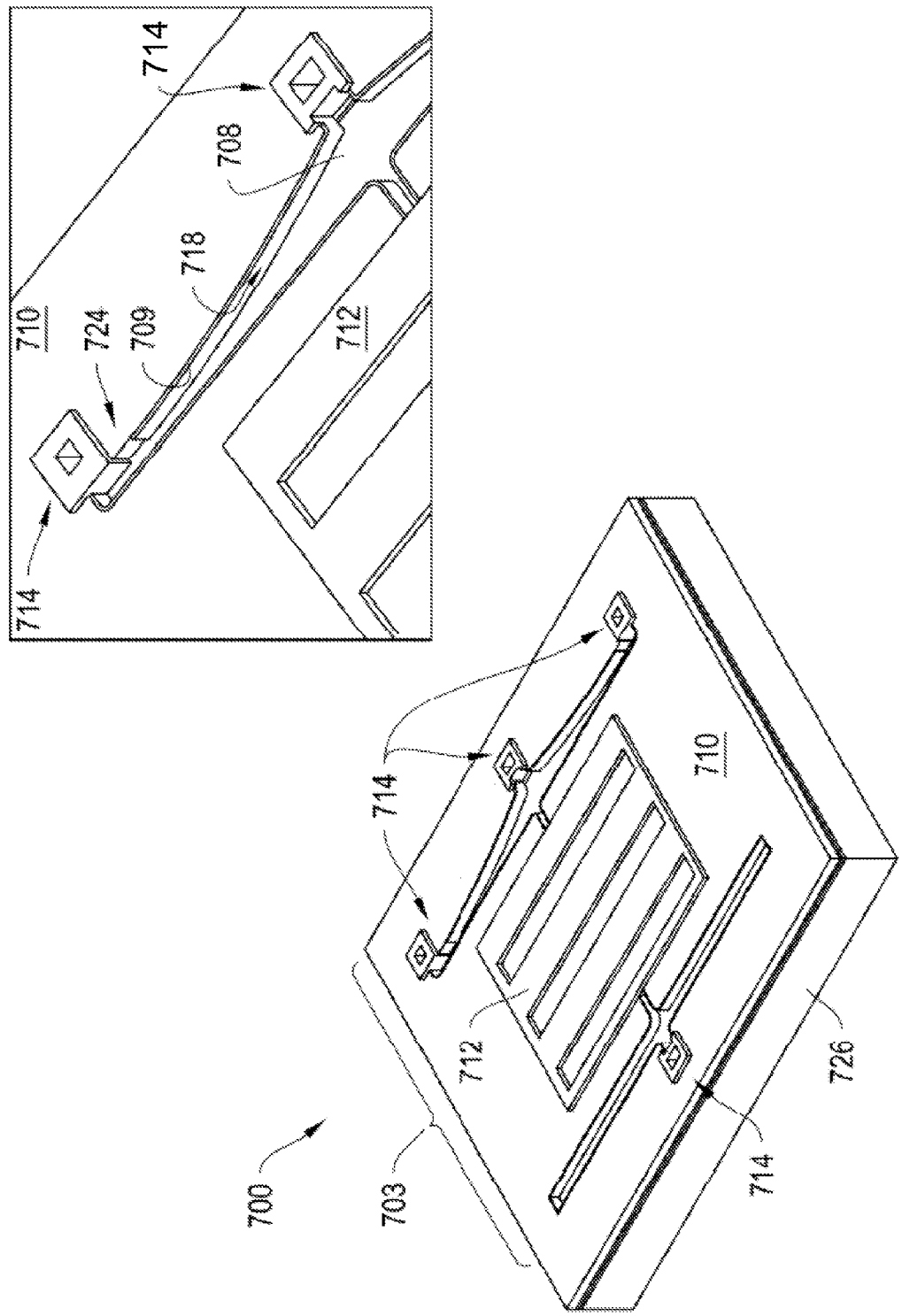

The process of forming the sidewall beams 716, 718 and 720 continues with the deposition and patterning of shutter material onto all of the exposed surfaces of the sacrificial mold 703, as depicted in FIG. 7C. Suitable materials for use in forming the shutter 712 are described above with respect to the first mechanical layer 605, the conductor layer 607, and the second mechanical layer 609 of FIGS. 6A-6E. The shutter material is deposited to a thickness of less than about 2 microns. In some implementations, the shutter material is deposited to have a thickness of less than about 1.5 microns. In some other implementations, the shutter material is deposited to have a thickness of less than about 1.0 microns, and as thin as about 0.10 microns. After deposition, the shutter material (which may be a composite of several materials as described above) is patterned, as depicted in FIG. 7C. First, a photoresist is deposited on the shutter material. The photoresist is then patterned. The pattern developed into the photoresist is designed such that the shutter material, after a subsequent etch stage, remains in the region of the shutter 712 as well as at the anchors 714.

The manufacturing process continues with applying an anisotropic etch, resulting in the structure depicted in FIG. 7C. The anisotropic etch of the shutter material is carried out in a plasma atmosphere with a voltage bias applied to the substrate 726 or to an electrode in proximity to the substrate 726. The biased substrate 726 (with electric field perpendicular to the surface of the substrate 726) leads to acceleration of ions toward the substrate 726 at an angle nearly perpendicular to the substrate 726. Such accelerated ions, coupled with the etching chemicals, lead to etch rates that are much faster in a direction that is normal to the plane of the substrate 726 as compared to directions parallel to the substrate 726. Undercut-etching of shutter material in the regions protected by a photoresist is thereby substantially eliminated. Along the vertical sidewalls 709 of the mold 703, which are substantially parallel to the track of the accelerated ions, the shutter material also is substantially protected from the anisotropic etch. Such protected sidewall shutter material form the sidewall beams 716, 718, and 720 for supporting the shutter 712. Along other (non-photoresist-protected) horizontal surfaces of the mold 703, such as the top horizontal surface 710 or the bottom horizontal surface 708, the shutter material has been substantially completely removed by the etch.

The anisotropic etch used to form the sidewall beams 716, 718 and 720 can be achieved in either an RF or DC plasma etching device as long as provision for electrical bias of the substrate 726 or of an electrode in close proximity to the substrate 726 is supplied. For the case of RF plasma etching, an equivalent self-bias can be obtained by disconnecting the substrate holder from the grounding plates of the excitation circuit, thereby allowing the substrate potential to float in the plasma. In some implementations, it is possible to provide an etching gas such as trifluoromethane (CHF3), perfluorobutene (C4F8), or chloroform (CHCl3) in which both carbon and hydrogen and/or carbon and fluorine are constituents in the etch gas. When coupled with a directional plasma, achieved again through voltage biasing of the substrate 726, the liberated carbon (C), hydrogen (H), and/or fluorine (F) atoms can migrate to the vertical sidewalls 709 where they build up a passive or protective quasi-polymer coating. This quasi-polymer coating further protects the sidewall beams 716, 718 and 720 from etching or chemical attack.

Figure 7D:
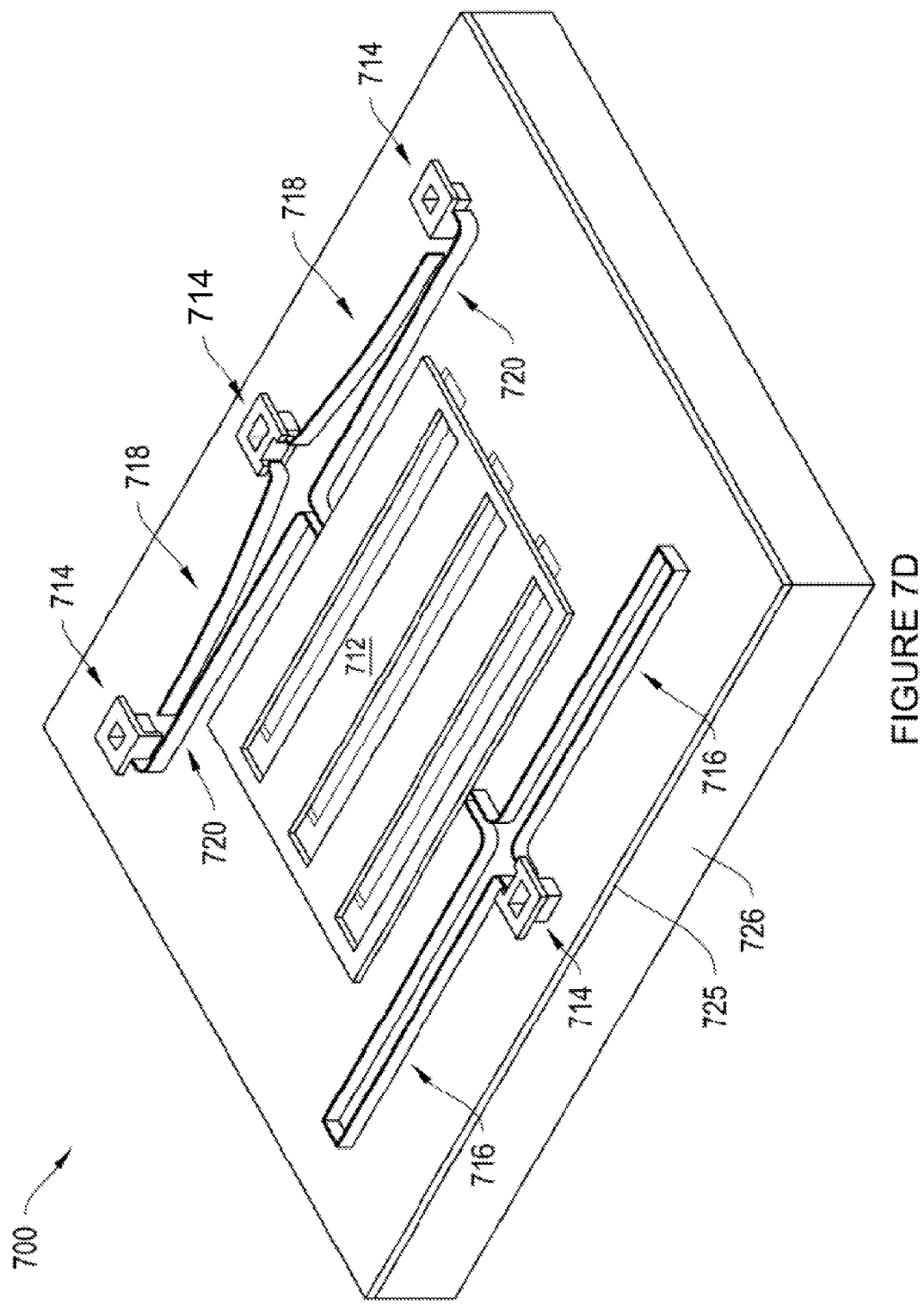

The process of forming the sidewall beams 716, 718 and 720 is completed with the removal of the remainder of the second sacrificial material 705 and the first sacrificial material 701. The result is shown in FIG. 7D. The process of removing sacrificial material is similar to that described with respect to FIG. 6E. The material deposited on the vertical sidewalls 709 of the mold 703 remain as the sidewall beams 716, 718 and 720. The sidewall beam 716 serves as a spring mechanically connecting one of the anchors 714 to the shutter 712, and also provides a passive restoring force and to counter the forces applied by the actuator formed from the compliant beams 718 and 720. The anchors 714 connect to an aperture layer 725. The sidewall beams 716, 718 and 720 are tall and narrow. The width of the sidewall beams 716, 718 and 720, as formed from the surface of the mold 703, is similar to the thickness of the shutter material as deposited. In some implementations, the width of sidewall beam 716 will be the same as the thickness of shutter 712. In some other implementations, the beam width will be about ½ the thickness of the shutter 712. The height of the sidewall beams 716, 718 and 720 is determined by the thickness of the second sacrificial material 705, or in other words, by the depth of the mold 703, as created during the patterning operation described in relation to FIG. 7B. As long as the thickness of the deposited shutter material is chosen to be less than about 2 microns, the process depicted in FIGS. 7A-7D is well suited for the production of narrow beams. In fact, for many applications the thickness range of 0.1 to 2.0 micron is quite suitable. Conventional photolithography would limit the patterned features shown in FIGS. 7A, 7B and 7C to much larger dimensions, for instance allowing minimum resolved features no smaller than 2 microns or 5 microns.

FIG. 7D depicts an isometric view of the shutter assembly 700, formed after the release operation in the above-described process, yielding compliant beams with cross sections of high aspect ratios. As long as the thickness of the second sacrificial material 705 is, for example, greater than about 4 times larger than the thickness of the shutter material, the resulting ratio of beam height to beam width will be produced to a similar ratio, i.e., greater than about 4:1.

An optional stage, not illustrated above but included as part of the process leading to FIG. 7C, involves isotropic etching of the sidewall beam material to separate or decouple the compliant load beams 720 from the compliant drive beams 718. For instance, the shutter material at point 724 has been removed from the sidewall through use of an isotropic etch. An isotropic etch is one whose etch rate is substantially the same in all directions, so that sidewall material in regions such as point 724 is no longer protected. The isotropic etch can be accomplished in the typical plasma etch equipment as long as a bias voltage is not applied to the substrate 726. An isotropic etch also can be achieved using wet chemical or vapor phase etching techniques. Prior to this optional fourth masking and etch stage, the sidewall beam material exists essentially continuously around the perimeter of the recessed features in the mold 703. The fourth mask and etch stage is used to separate and divide the sidewall material, forming the distinct beams 718 and 720. The separation of the beams 718 and 720 at point 724 is achieved through a fourth process of photoresist dispense, and exposure through a mask. The photoresist pattern in this case is designed to protect the sidewall beam material against isotropic etching at all points except at the separation point 724.

As a final stage in the sidewall process, an encapsulating dielectric is deposited around the outside surfaces of the sidewall beams 716, 718 and 720.

In order to protect the shutter material deposited on the vertical sidewalls 709 of the mold 703 and to produce the sidewall beams 716, 718 and 720 of substantially uniform cross section, some particular process guidelines can be followed. For instance, in FIG. 7B, the sidewalls 709 can be made as vertical as possible. Slopes at the vertical sidewalls 709 and/or exposed surfaces become susceptible to the anisotropic etch. In some implementations, the vertical sidewalls 709 can be produced by the patterning operation at FIG. 7B, such as the patterning of the second sacrificial material 705 in an anisotropic fashion. The use of an additional photoresist coating or a hard mask in conjunction with patterning of the second sacrificial layer 705 allows the use of aggressive plasmas and/or high substrate bias in the anisotropic etch of the second sacrificial material 705 while mitigating against excessive wear of the photoresist. The vertical sidewalls 709 also can be produced in photoimageable sacrificial materials as long as care is taken to control the depth of focus during the UV exposure and excessive shrinkage is avoided during final cure of the resist.

Another process guideline that helps during sidewall beam processing relates to the conformality of the shutter material deposition. The surfaces of the mold 703 can be covered with similar thicknesses of the shutter material, regardless of the orientation of those surfaces, either vertical or horizontal. Such conformality can be achieved when depositing with CVD. In particular, the following conformal techniques can be employed: PECVD, low pressure chemical vapor deposition (LPCVD), and atomic or self-limited layer deposition (ALD). In the above CVD techniques the growth rate of the thin film can be limited by reaction rates on a surface as opposed to exposing the surface to a directional flux of source atoms. In some implementations, the thickness of material grown on vertical surfaces is at least 50% of the thickness of material grown on horizontal surfaces. Alternatively, shutter materials can be conformally deposited from solution by electroless plating or electroplating, after a metal seed layer is provided that coats the surfaces before plating.

Figure 8A:
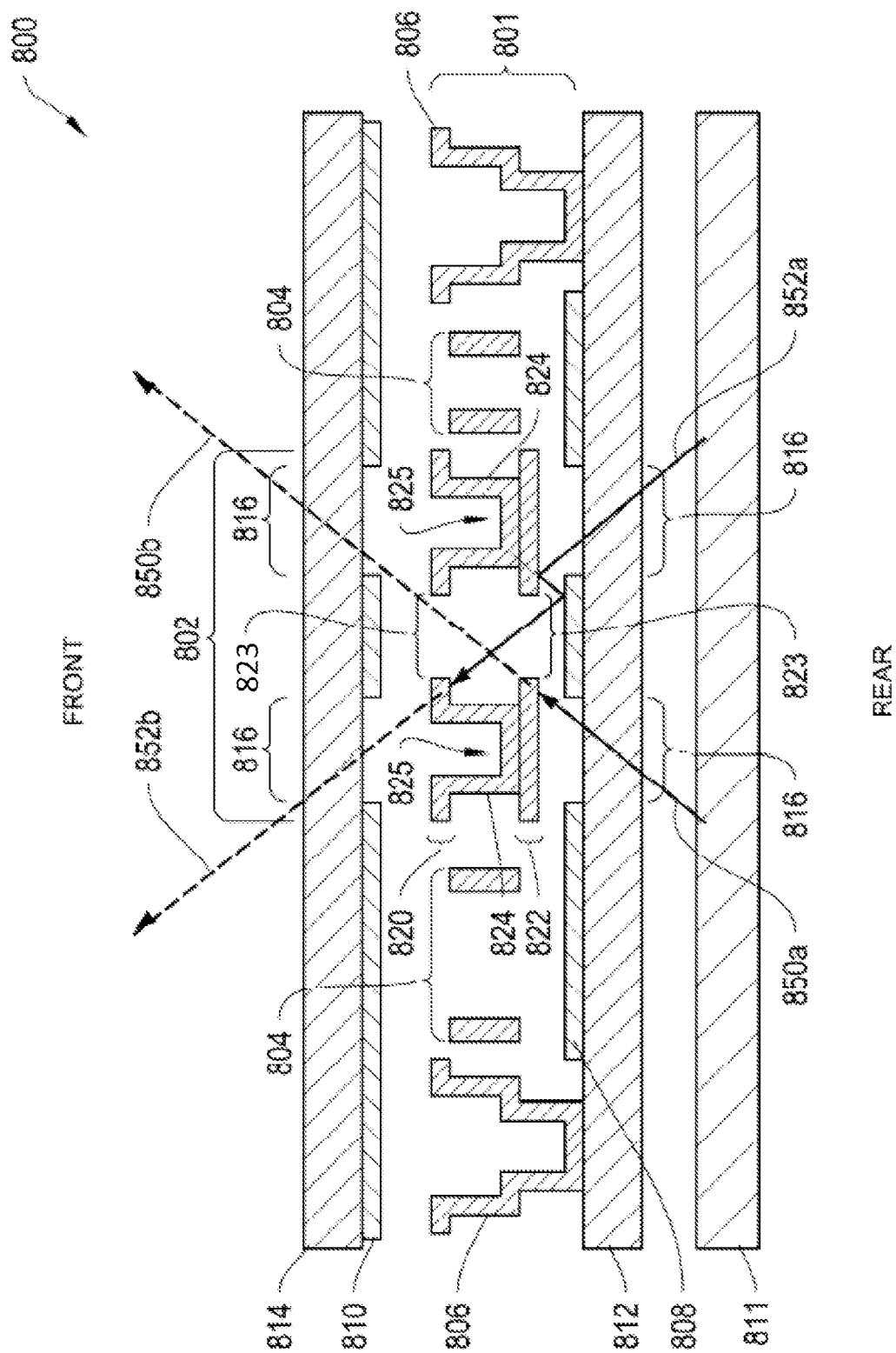
FIG. 8A shows a cross-section view of an example display apparatus.
Figure 8B:
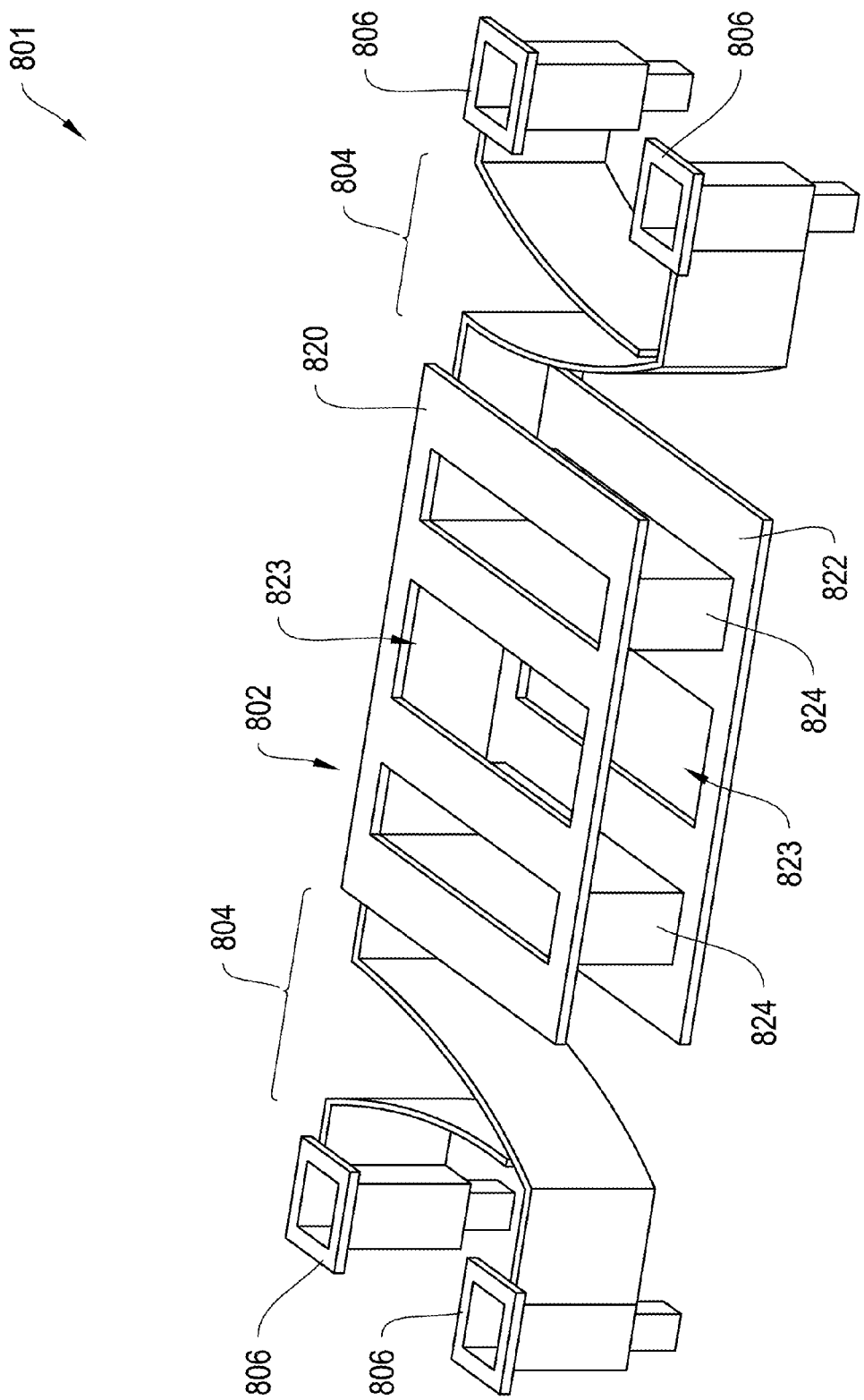
FIG. 8B shows a perspective view of a shutter assembly incorporated into the example display apparatus shown in FIG. 8A.

FIG. 8A shows a cross-sectional view of an example display apparatus 800. FIG. 8B shows a perspective view of a shutter assembly 801 incorporated into the example display apparatus 800. Referring to FIGS. 8A and 8B, the display apparatus 800 includes a shutter 802 supported by actuators 804 and anchors 806 between two light blocking layers 808 and 810. The rear light blocking layer 808 is formed on a substrate 812, on which the shutter 802, actuators 804 and anchors 806 are likewise formed. The front light blocking layer 810 is formed on a coversheet 814 of the display. Each of the light blocking layers 808 and 810 include apertures 816 defined through them, forming optical paths from a backlight 811 positioned behind the substrate 812, through a pair of opposing apertures 816, and out of the front of the display apparatus 800. The actuators 804 selectively move the shutter 802 into and out of these optical paths to obstruct the passage of light along the path, thereby forming an image.

The shutter 802 includes two light obstructing levels, a front light obstructing level 820 and a rear light obstructing level 822. The front and rear light obstructing levels 820 and 822 are connected by a side wall 824. The front light obstructing level 820 is spaced a relatively short distance, between about 2 microns and about 10 microns, away from the front light blocking layer 810 and is generally aligned with edges of the actuator 804. The distance is maintained by a set of spacers (not shown) separating the substrate 812 from the cover sheet 814. The rear light obstructing level 822 is likewise spaced a relatively short distance, between about 2 and about 10 microns away, from the rear light blocking layer 808. This distance is maintained by the anchors 806. In some implementations, the front light obstructing level 820 is positioned about the same distance from the front light blocking layer 810 as the rear light obstructing level 822 is spaced from the rear light blocking layer 808. In some other implementations, the separation distances are different, but within about 3 microns of one another. As a result of these similar separation distances, a light obstructing portion of the shutter 802 is proximate to, and can substantially obstruct the passage of light through the apertures 816 formed in, both the rear and front light blocking layers 808 and 810.

The front and rear light obstructing levels 820 and 822 define a pair of shutter apertures 823. The shutter apertures 823 are aligned with one another such that when the shutter 802 is in the open position, the optical path through a corresponding pair of apertures 816 in the rear and front light blocking layers 808 and 810 is clear. Light is then able to pass through an aperture 816 in the rear light blocking layer 808, through the shutter apertures 823, and through the aperture 816 in the front light blocking layer 810, and out of the display apparatus 800.

The benefits of the two light obstructing levels 820 and 822 can be seen in relation to two illustrative light rays 850a and 852a. In FIG. 8A, the shutter 802 is in a closed position, and therefore should block substantially all light passing through the rear apertures 816. The light ray 850a demonstrates how the rear light obstructing level 822 can help prevent off-angle light from bypassing the shutter 802 and leaking out of the display. The dashed line 850b illustrates the path the light ray 850a would have taken were the rear light obstructing level 822 not included. The light ray 852a demonstrates how the front light obstructing level 820 of the shutter 802 can help prevent light that reflects off of the rear light obstructing level 822 and rebounds off of the front surface of the rear light blocking layer 808 from undesirably leaving the display apparatus 800. The line 852b shows the path of the light ray 852a were the front light obstructing level 820 omitted from the shutter 802.

Moreover, as a result of the fabrication process used to fabricate the shutter assembly 801, portions 825 of the rear light obstructing level 822 of the shutter 802 are substantially thicker than a remainder of the rear light obstructing level 822. As shown in FIG. 8A, in some implementations, when the shutter 802 is in the closed position, these thicker portions 825, are aligned directly between pairs of opposing apertures 816. The extra thickness increases the light blocking ability of the shutter 802, further improving the contrast ratio of the display apparatus 800.

In some other implementations, the shutter assembly 801 is fabricated on a substrate located at the front of the display where the coversheet 814 is shown in FIG. 8A (i.e., in a MEMS-down configuration). The shutter assembly 801 in such implementations extends down towards an aperture plate, on which a rear light blocking layer is formed, and which is located in the position where the substrate 812 is shown in FIG. 8A. In some other implementations, either the front or rear light blocking layer 810 or 808, depending on the orientation of the shutter assembly 801, is replaced with an elevated aperture layer. The elevated aperture layer would be fabricated on the same substrate as the shutter assembly 801. Such an elevated aperture layer includes a light blocking layer that defines apertures positioned in alignment with the apertures 816 defined by the light blocking layer 808 or 810.

Figure 9:
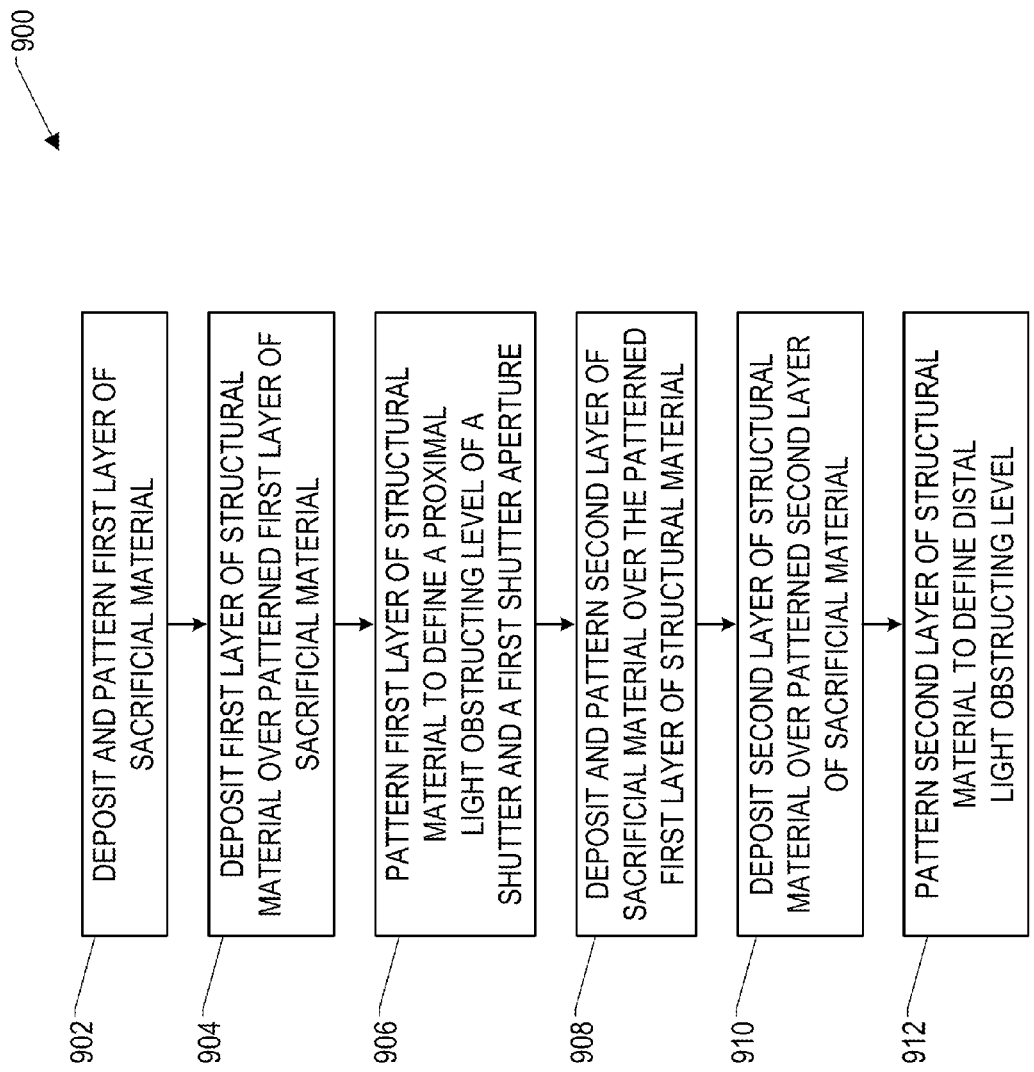
FIG. 9 shows a flow diagram of an example method for fabricating the shutter assembly shown in FIGS. 8A and 8B.

FIG. 9 shows a flow diagram of an example method 900 for fabricating the shutter assembly 801 shown in FIGS. 8A and 8B. In brief overview, the method 900 includes depositing and patterning a first layer of sacrificial material (stage 902), depositing a first layer of structural material over the patterned first layer of sacrificial material (stage 904), and patterning the first layer of structural material to define a proximal light obstructing level of the shutter and a shutter aperture (stage 906). The method 900 further includes depositing and patterning a second layer of sacrificial material over the patterned first layer of structural material (stage 908), depositing a second layer of structural material over the patterned second layer of sacrificial material (stage 910), and patterning the second layer of structural material to define a distal light obstructing level of the shutter (stage 912). FIGS. 10A-10H show cross sectional views of the results of each of the processing stages included in the method shown in FIG. 9.

Referring to FIGS. 8A, 8B, 9 and 10A-10H, the method 900 begins with depositing and patterning a first layer of sacrificial material 1002 (stage 902). More particularly, the first layer of sacrificial material 1002 is deposited on top of a light blocking layer 1004, such as the rear light blocking layer 808 shown in FIG. 8A. Prior to the deposition of the first layer of sacrificial material 1002, the rear light blocking layer 1004 was patterned to form apertures, such as the apertures 816, also shown in FIG. 8A. The sacrificial material can be any of the materials described above in relation to FIG. 6B as being suitable for use as sacrificial material. The first layer of sacrificial material 1002 can be applied through a spin-on process to yield a substantially planar upper surface. In some implementations, the first layer of sacrificial material 1002 is deposited to be about 1 micron to about 10 microns thick. In some implementations, the first layer of sacrificial material 1002 is deposited to be about 3 microns to about 5 microns thick. This process yields the structure shown in FIG. 10A.

Figure 10A:
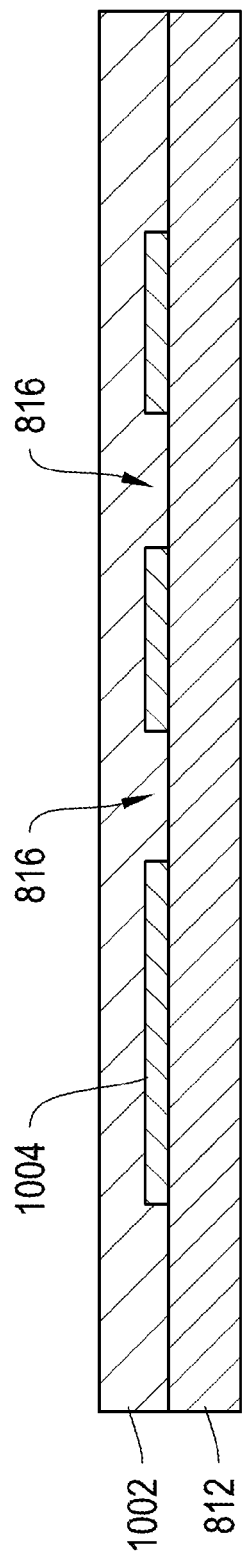
FIGS. 10A-10H show cross sectional views of the results of each of the processing stages included in the method shown in FIG. 9.
Figure 10B:
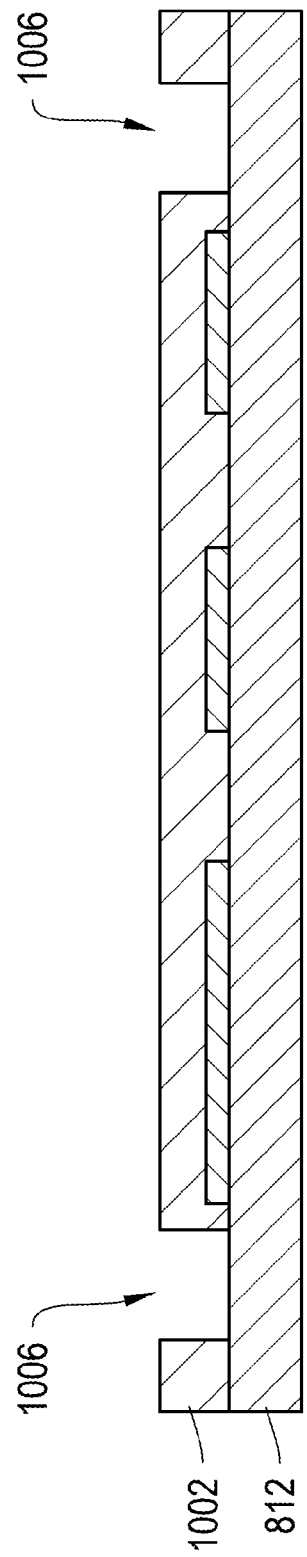

The first layer of sacrificial material 1002 is then patterned to form recesses 1006 that will serve as molds for the lower portions of anchors, such as the anchors 806, shown in FIGS. 8A and 8B. The first layer of sacrificial material 1002 can be patterned in a number of ways, depending on the materials used. More particularly, the first layer of sacrificial material 1002 can be patterned by any of the sacrificial layer patterning processes described above in relation to FIG. 6B. For example, for photosensitive sacrificial materials, the first layer of sacrificial material 1002 can be directly exposed through a photo mask and developed, removing undesired sacrificial material. For other types of sacrificial materials, a separate resist is first deposited on the first layer of sacrificial material 1002. The resist is then patterned and used as an etch mask in an etching process that removes portions of the layer sacrificial material 1002 exposed through the patterned resist. The results of this process are shown in FIG. 10B.

While not shown, in some implementations, several additional layers, including metal layers and inter-metal dielectric layers are deposited on top of the light blocking layer 1004 and are patterned prior to the deposition of the first layer of sacrificial material 1002. These additional layers form or include the control matrix that will control the shutter assembly when completed. In some other implementations, the additional metal and inter-metal dielectric layers are deposited on the transparent substrate 812 and patterned prior to deposition of the light blocking layer 1004.

Figure 10C:
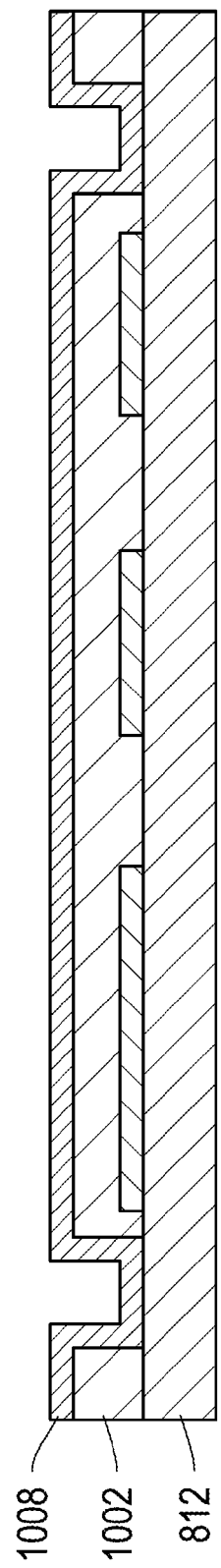

A first layer of structural material 1008 is then deposited on top of the patterned layer of sacrificial material 1002 (stage 904). The structural material is deposited using a CVD, PECVD, PVD, or ALD process, substantially conformally coating the exposed surfaces of the first layer of sacrificial material 1002 and any other surfaces exposed through the recesses 1006. The structural material can include one or more layers of metal and/or semiconductor material, as described above in relation to FIG. 6C as being suitable shutter materials. The structural material can be deposited to have a total thickness of less than about 2.0 microns. The results of this deposition stage (stage 904) are shown in FIG. 10C.

The first layer of structural material 1008 is patterned to form a proximal light obstructing level 1010 of the shutter assembly 801 (stage 906). As used herein, the term proximal is used with respect to the substrate on which the shutter assembly 801 is being fabricated. For the display apparatus 800 shown in FIG. 8A, the proximal light obstructing level 1010 would correspond to the rear light obstructing level 822. The front light obstructing level 820, being further from the substrate 812 would be considered a distal light obstructing level.

The first layer of structural material 1008 can be patterned using one or more etch processes. For example, in some implementations, the first layer of structural material 1008 is first etched using an anisotropic etch to remove unwanted structural material from the horizontal surfaces of the structure shown in FIG. 10C. A second isotropic etch can then be used to remove any unwanted structural material on the vertical surfaces. In some other implementations, a single isotropic etch can be used to simultaneously remove material on both the horizontal and vertical surfaces of the structure.

Figure 10D:
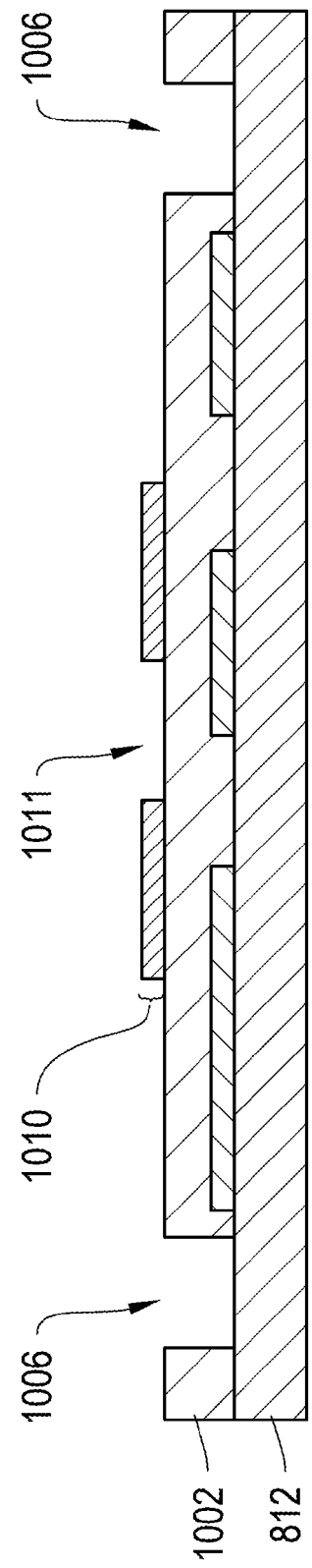
Figure 10E:
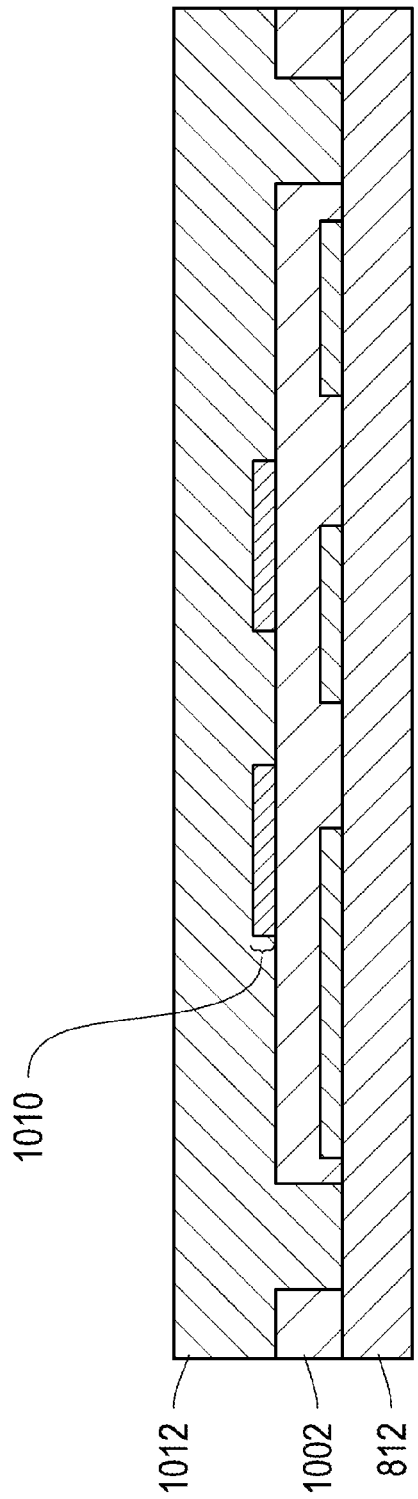

Together, in some implementations, the one or more etching processes remove all of the first layer of structural material 1008 other than the material that will form the proximal light obstructing level 1010, as shown in FIG. 10D. Such etching defines the perimeter of the proximal light obstructing level 1010, as well as a proximal shutter aperture 1011. In some other implementations, structural material is also left on one or more surfaces of the recesses 1006.

A second layer of sacrificial material 1012 is then deposited and patterned (stage 908). The second layer of sacrificial material 1012 is deposited over the structure shown in FIG. 10D using, for example, a spin-on process yielding the structure shown in FIG. 10E. The second layer of sacrificial material 1012 can be or can include the same material used for the first layer of sacrificial material 1002, or it can include any of the other materials identified above as being suitable for use as a sacrificial material. The second layer of sacrificial material 1012 is deposited to a thickness of between about 1 and about 10 microns. In some implementations, the second layer of sacrificial material 1012 is deposited to a thickness of between about 3 and about 5 microns.

Figure 10F:
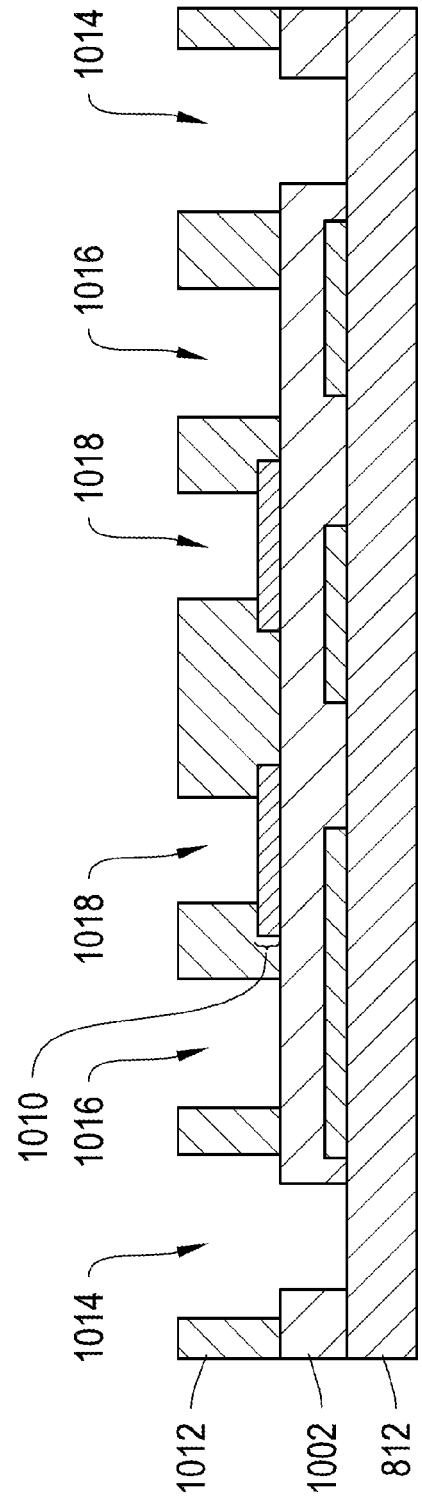

The second layer of sacrificial material 1012 is patterned to form a number of additional recesses. Specifically, the patterning results in two new anchor recesses 1014 positioned over the recesses 1006 formed in the first layer of sacrificial material 1002 to serve as molds for the anchors 806. Two actuator recesses 1016 are formed. The sidewalls of the actuator recesses 1016 define molds for the beams of the electrostatic actuators 804. The actuator recesses 1016 extend down to the upper surface of the first layer of sacrificial material 1002. As result, the edges of the actuator beams that are formed using this mold that are proximal to the substrate 812 are about the same distance away from the substrate 812 as the proximal light obstructing level 1010. In addition, two shutter recesses 1018 are formed in the second layer of sacrificial material 1012. The shutter recesses 1018 define molds for the sidewalls 824 of the shutter 802 and extend down to the remaining structural material from the first layer of structural material 1008, which forms the proximal light obstructing level 1010. The resulting structure is shown in FIG. 10F.

Figure 10G:
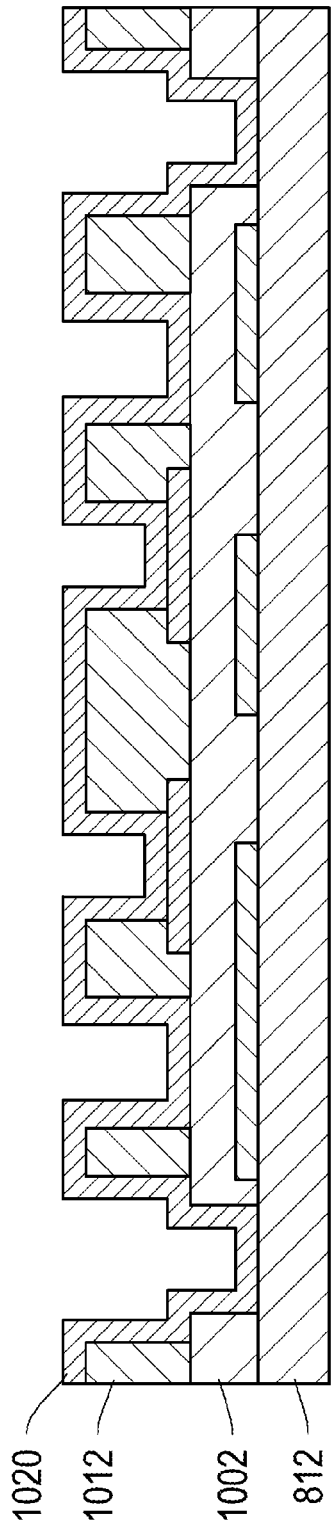

A second layer of structural material 1020 is then deposited (stage 910) over the structure shown in 10F. The structural material substantially conformally coats the exposed surfaces of the structure, as shown in FIG. 10G. The second layer of structural material 1020 can be any of the structural materials referred to above, including the same material used for the first layer of structural material 1008. It, too, can be deposited to a thickness of less than about 2 microns.

Figure 10H:
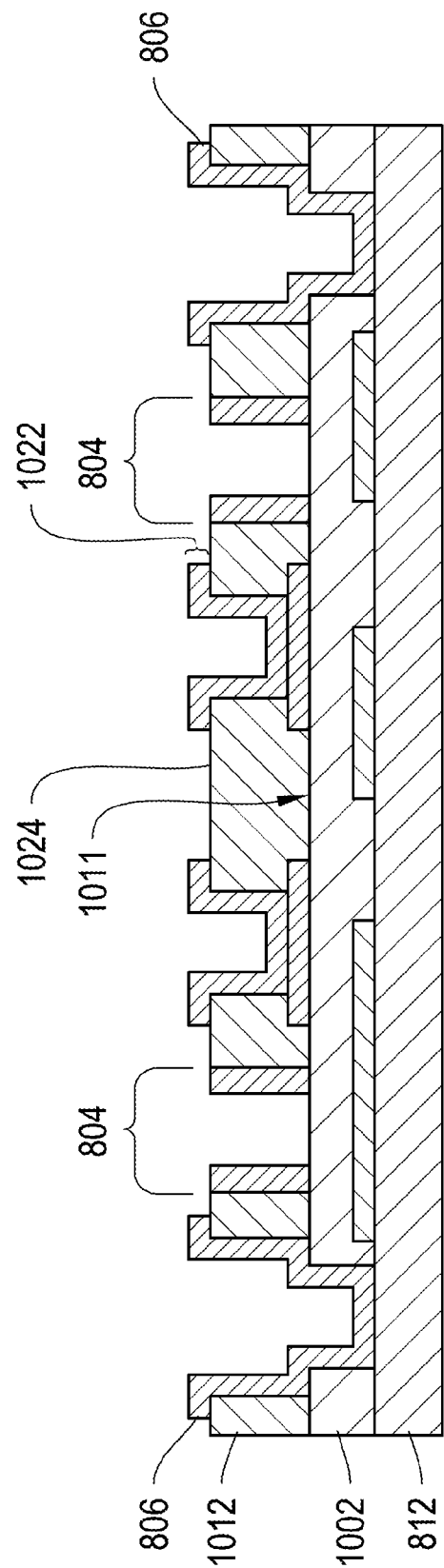

Next, the second layer of structural material 1020 is patterned to define a distal light obstructing level 1022 (stage 912) as shown in FIG. 10H. The front light obstructing level 820 shown in FIGS. 8A and 8B is an example of a distal light obstructing level 1022. More particularly, the second layer of structural material 1020 is patterned to define the periphery of the distal light blocking layer 1022 as well as to define a distal shutter aperture 1024 in the distal light blocking layer 1022. The distal shutter aperture 1024 is defined in alignment with the proximal shutter aperture 1011.

This patterning stage (stage 912) also defines the anchors 806 and the beams of the electrostatic actuators 804. The front light obstructing level 1022 is spaced about the same distance over the substrate 812 as the distal edges of the beams of the electrostatic actuators 804. In some implementations, the patterning process may remove a small portion of structural material from the distal-most edges of the actuator beams. Thus, the front light obstructing level 1022 of the shutter 802 may be spaced slightly further above the substrate 812 than the distal ends of the actuator beams, while still being spaced about the same distance. As with the prior structural material patterning stage (stage 906), the second layer of structural material 1020 can likewise be patterned using one or more etching processes including an anisotropic and/or an isotropic etch. The result of the patterning stage (stage 912) is shown in FIG. 10H. This structure can then be released yielding the shutter assembly 801 shown in FIGS. 8A and 8B.

As described above, both the proximal shutter aperture 1011 and the distal shutter aperture 1024 are etched through a surface which, when etched, is at the uppermost level of the material stack being etched. That is, neither shutter aperture 1011 or 1024 is being etched through material at the bottom of a recess formed in the material stack. This allows for more precise control of the etching process. When etching structural material located on the bottom of a recess, the sidewalls of the recess can provide a shadowing effect that limits precise patterning near the sidewalls. No such shadow can interfere with the etching of material on the top of a material stack. Effectively depositing and patterning a resist layer at the bottom of a recess can also pose challenges that are avoided by etching material at the top of a material stack.

Figure 11A:
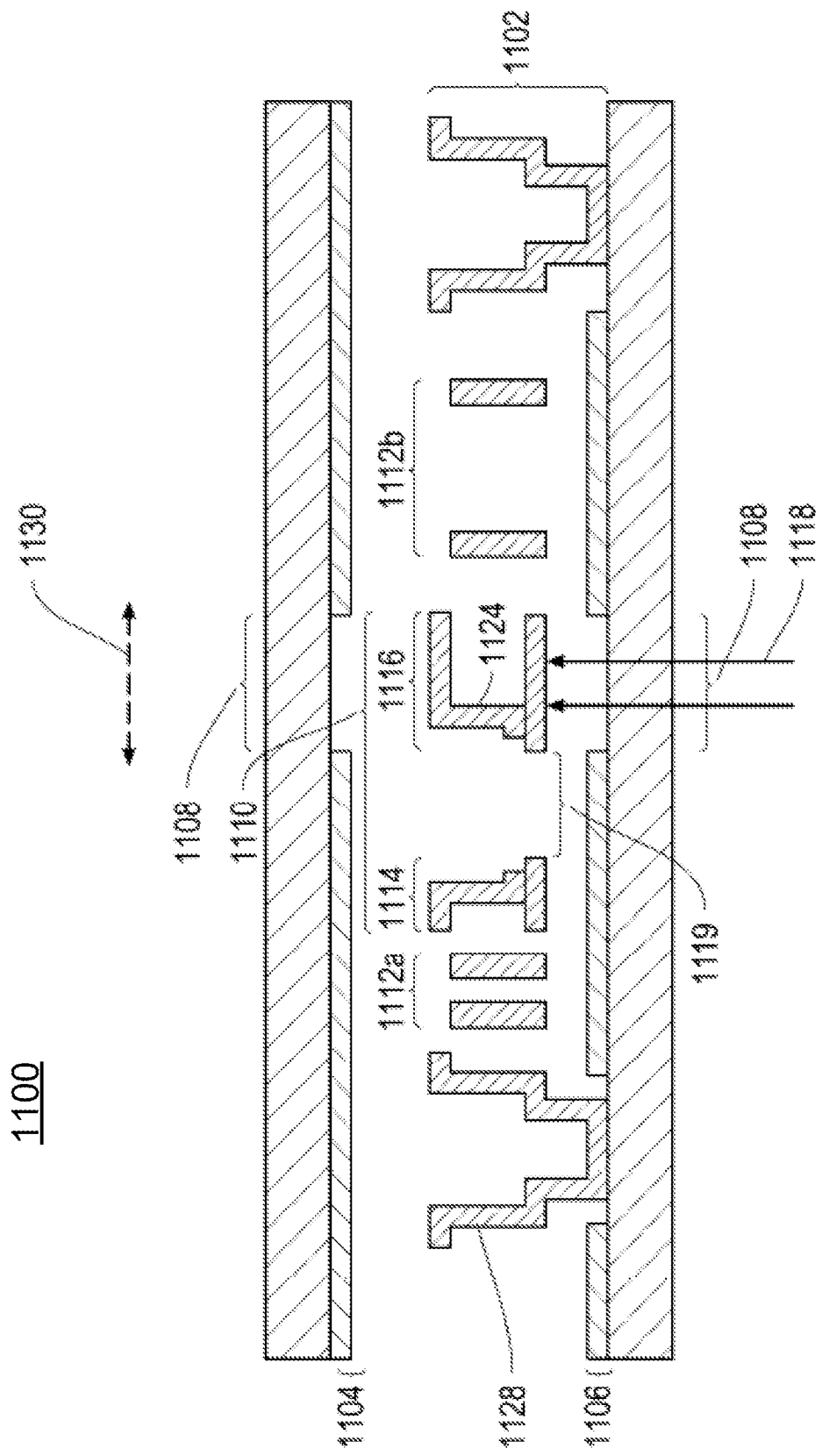
FIGS. 11A-11C show cross-sectional views of another example display apparatus.
Figure 11B:
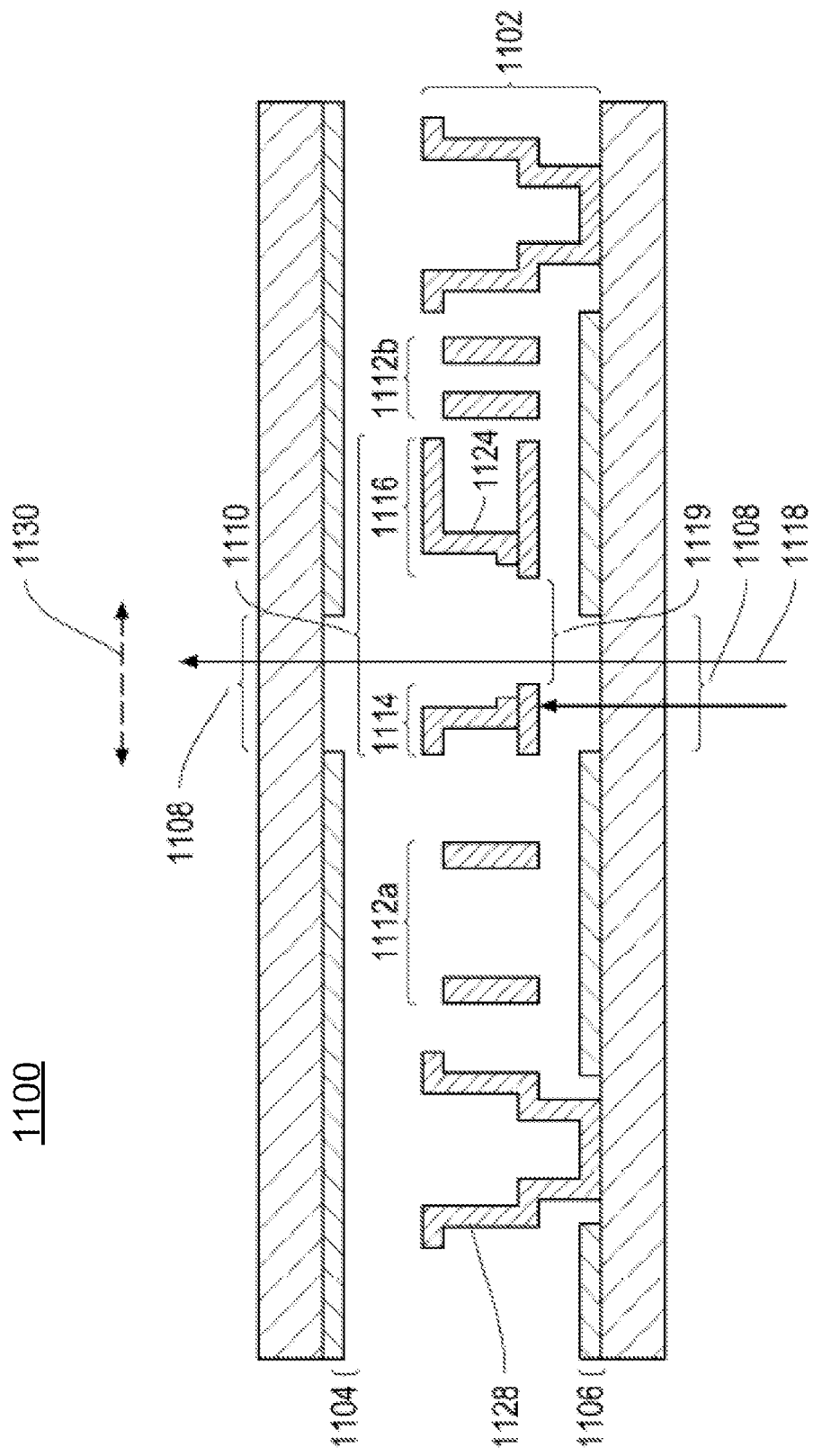
Figure 11C:
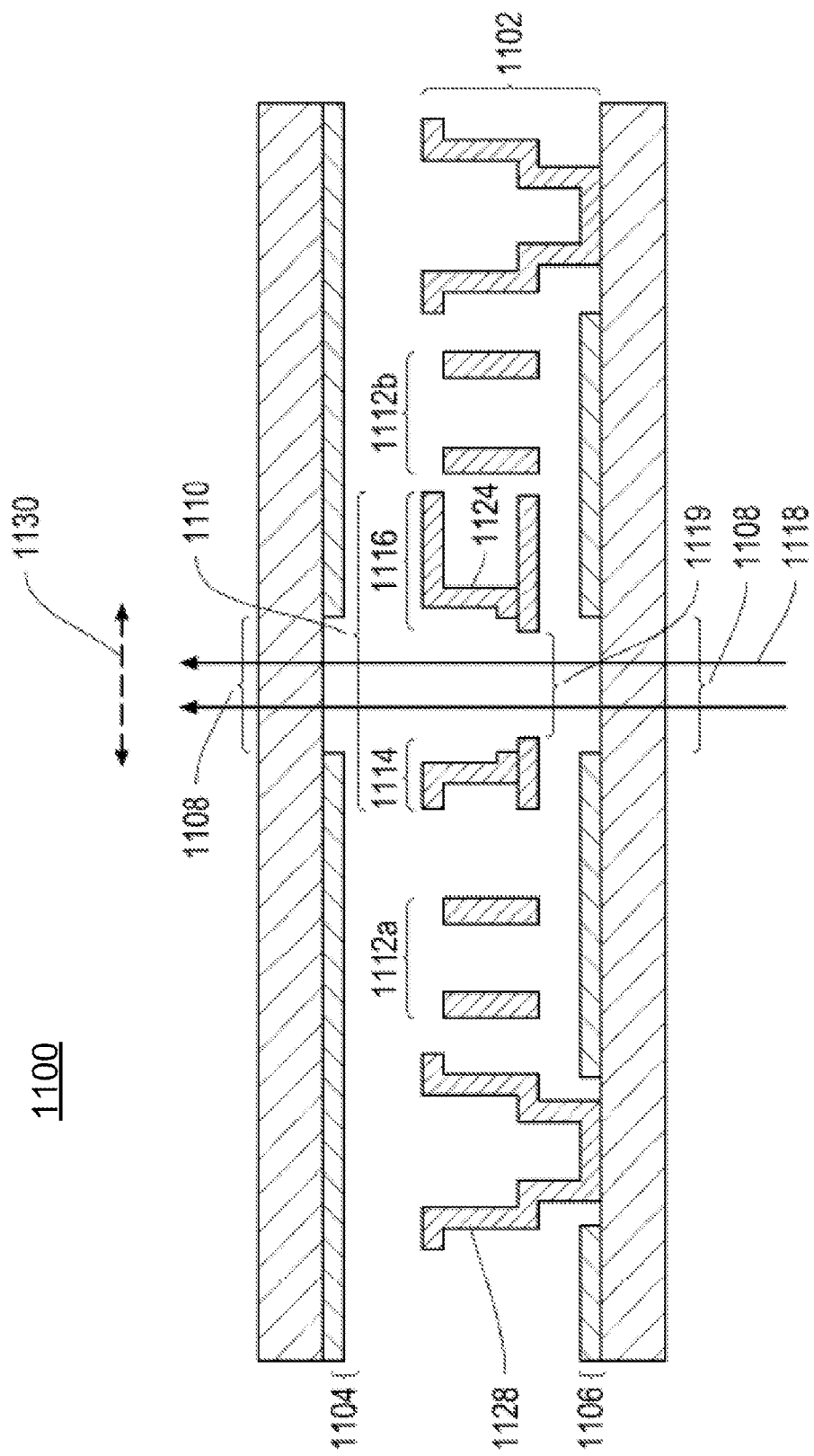
Figure 11D:
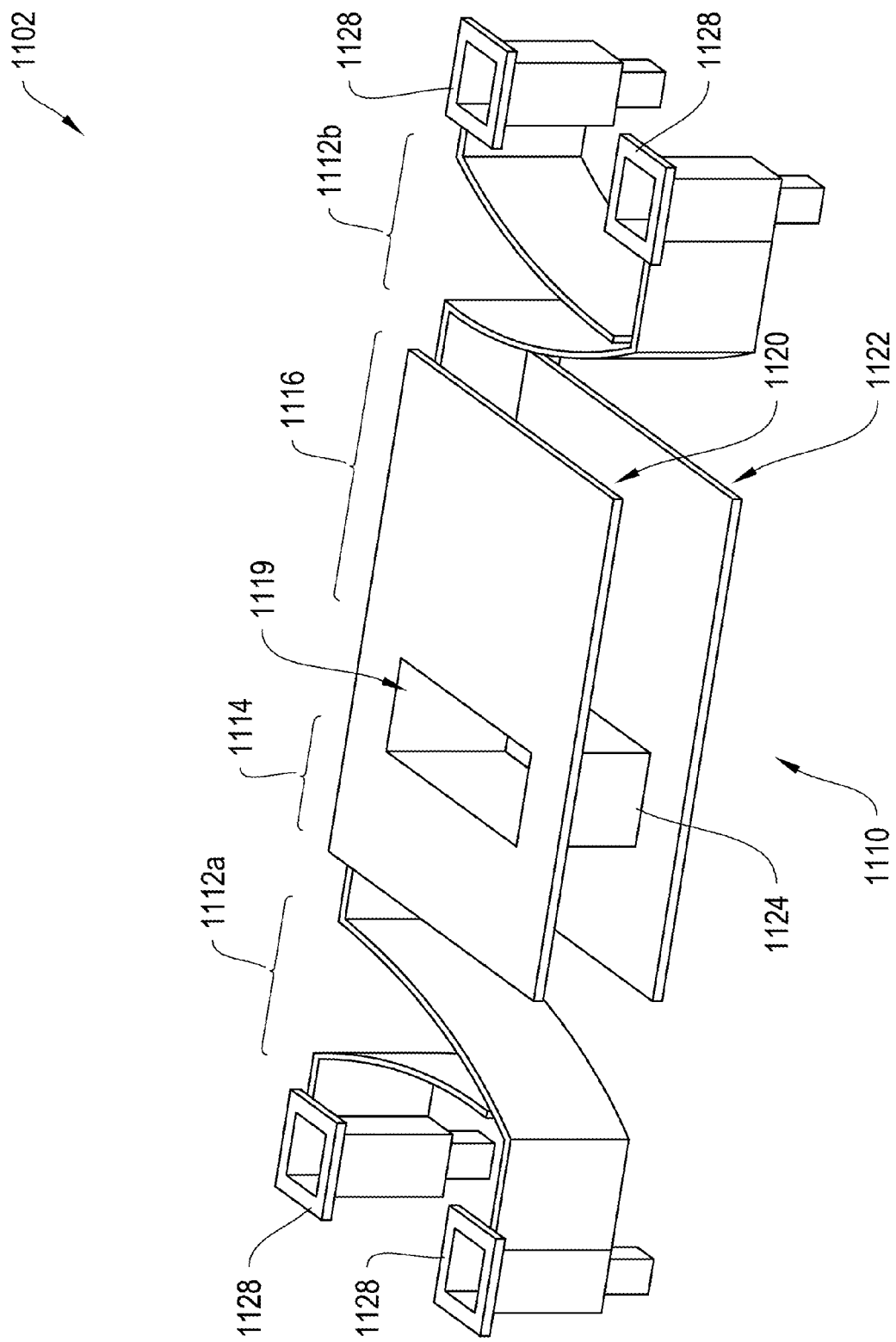
FIG. 11D shows an example perspective view of the shutter assembly incorporated into the display apparatus shown in FIGS. 11A-11C.

FIGS. 11A-11C show cross-sectional views of another example display apparatus 1100. More particularly, FIGS. 11A-11C show a shutter assembly 1102 incorporated into the display apparatus 1100 in each of three distinct states the shutter assembly can be switched between. The shutter assembly 1102 can enter into a closed state, as shown in FIG. 11A or a partially open state, as shown in FIG. 11B; an open state, as shown in FIG. 11C. FIG. 11D shows an example perspective view of the shutter assembly 1102 incorporated into the display apparatus 1100 shown in FIGS. 11A-11C.

Referring to FIGS. 11A-11D, the display apparatus includes the shutter assembly 1102 disposed between a front light blocking layer 1104 and a rear light blocking layer 1106. Pairs of apertures 1108 are defined through the front and rear light blocking layers 1104 and 1106. The shutter assembly 1102 includes a shutter 1110, which is moved by electrostatic actuators 1112a and 1112b into and out of an optical path formed through the pair of apertures 1108 formed in the front and rear light blocking layers 1104 and 1106.

The shutter assembly 1102 can achieves three distinct light modulating states due to the asymmetric shape of the shutter 1110. In particular, the shutter 1110 includes two light obstructing portions, a short light obstructing portion 1114 and a long light obstructing portion 1116. The length of the short light obstructing portion 1114, along the direction of travel of the shutter 1110, is substantially shorter than the length of the long light obstructing portion 1116. In some implementations, the short light obstructing portion 1114 has about half the length of the long light obstructing portion 1116. In other implementations, the short light obstructing portion 1114 can have about ¼, ¾, or other fraction of the length of the long light obstructing portion 1116.

In operation, the shutter assembly 1102 moves the shutter 1110 laterally with respect to the apertures 1108 formed in the front and rear light blocking layers 1104 and 1106 on either side of the shutter 1110. The long light obstructing portion 1116 is long enough such that when the shutter assembly 1102 is in the closed state (as shown in FIG. 11A), the long light obstructing portion 1116 fully obstructs light 1118 passing through the apertures 1108. In this state, a first electrostatic actuator 1112a moves the shutter 1110 all the way to one side of the shutter assembly 1102.

The short light obstructing portion 1114 is short enough, such that when the shutter assembly 1102 is in a partially open state (shown in FIG. 11B), the short light obstructing portion 1114 only partially obstructs the apertures 1108. For example, in some implementations, the short light obstructing portion 1114 may be long enough to obstruct about one-quarter, about one-half, about three-quarters, or any other fraction of the area of the apertures 1108. In this state, a second electrostatic actuator 1112b moves the shutter 1110 all the way to the other end of the shutter assembly 1102.

The light obstructing portions 1114 and 1116 are separated by a shutter aperture 1119 formed through the shutter 1110. When the shutter assembly 1102 is in the open state (shown in FIGS. 11C and 11D), the shutter aperture 1119 is in substantial alignment with the apertures 1108 formed in the front and light blocking layers 1104 and 1106. The electrostatic actuators 1112a and 1112b are both relaxed (or unactuated) in this state, leaving the shutter 1110 in about the middle of the shutter assembly 1102. In some implementations, the light obstructing portions 1114 and 1116 may each slightly obstruct the apertures 1108 in this state, but not to a significant degree.

Each of the light obstructing portions 1114 and 1116 includes both a front light obstructing level 1120 and a rear light obstructing level 1122. The front light obstructing level 1120 and the rear light obstructing level 1122 are connected by sidewalls 1124 that surround the shutter aperture 1119. In some implementations, the front light obstructing level 1120 is positioned about the same distance from the front light blocking layer 1104 as the rear light obstructing level 1122 is spaced from the rear light blocking layer 1106. In some other implementations, the separation distances are different, but within about 3 microns of one another. As a result, a light obstructing level of the shutter 1110 is proximate to, and can substantially obstruct the passage of light through the apertures 1108 formed in both the front and rear light blocking layers 1104 and 1106.

While the shutter assembly 1102 is shown in a MEMS-up configuration, in some other implementations, the shutter assembly 1102 can be integrated into a display apparatus in a MEMS-down configuration. In some other implementations, either the front or rear light blocking layer 1104 or 1106, depending on the orientation of the shutter assembly 1102 (i.e., MEMS-up or MEMS-down), is replaced with an elevated aperture layer. The elevated aperture layer would be fabricated on the same substrate as the shutter assembly 801. Such an elevated aperture layer includes a light blocking layer that defines apertures positioned in alignment with the apertures 1108 defined by the light blocking layers 1104 or 1106. In addition, in some implementations, the shutter assembly 1102 can include shutter that includes only one light obstructing level. An example of such a shutter assembly is shown in FIG. 11E.

Figure 11E:
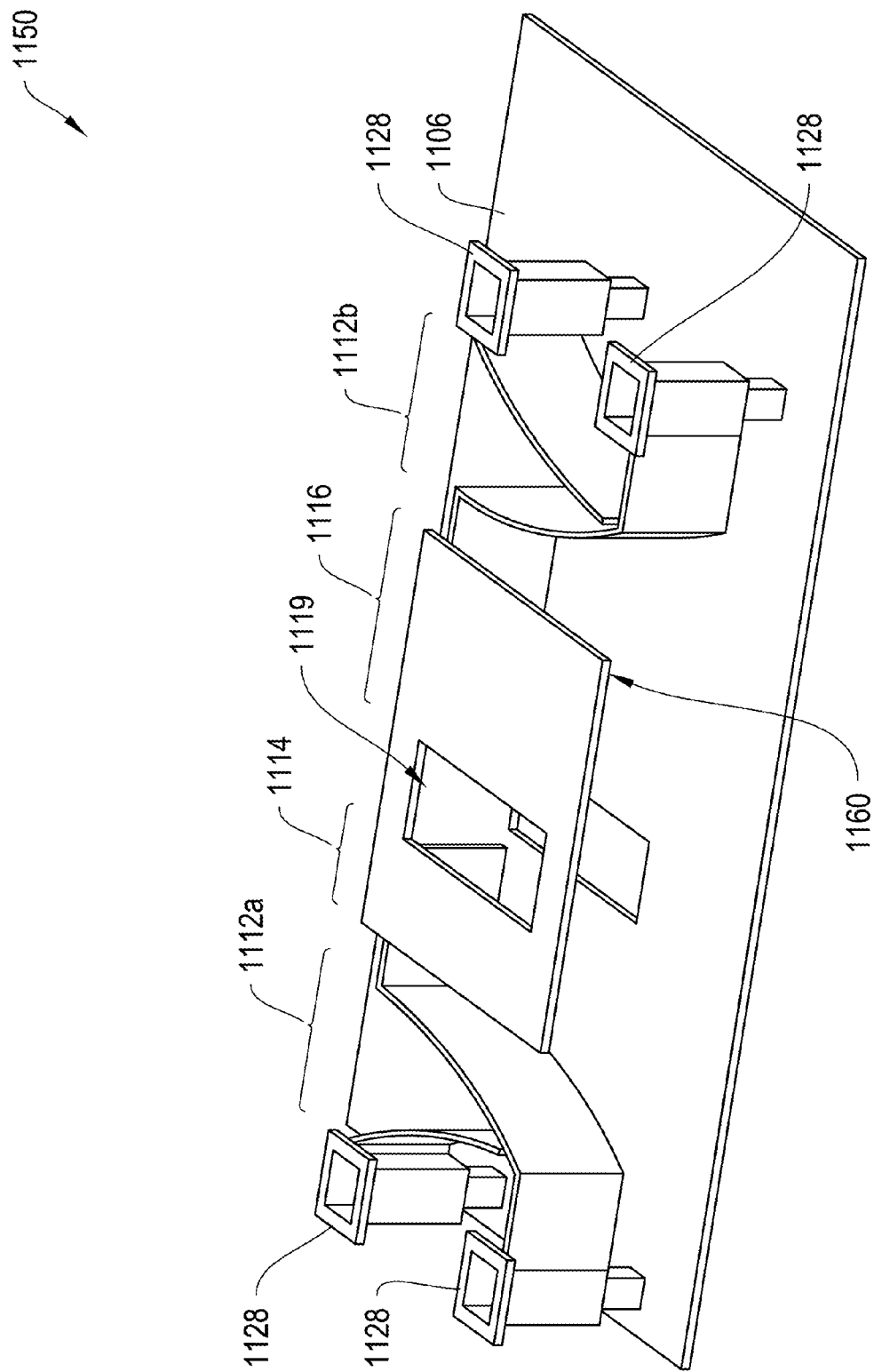
FIG. 11E shows a perspective view of another example shutter assembly similar to the shutter assembly shown in FIGS. 11A-11D.

FIG. 11E shows an example perspective view of another example shutter assembly 1150 similar to the shutter assembly 1102 shown in FIGS. 11A-11D. More particularly, the shutter assembly 1150 includes a shutter 1160 that has only a single light obstructing level, instead of having the separate front and rear light blocking levels 1120 and 1122 included in the shutter 1110 shown in FIGS. 11A-11D. Similar to the shutter 1110, though, the shutter 1160 includes both short and long light blocking portions 1114 and 1116. The shutter 1160 is also supported by opposing actuators 1112a and 1112b, and is supported over a light blocking layer 1106 by anchors 1128. The shutter assembly 1150 can be operated in the same fashion as the shutter assembly 1102, moving the shutter 1160 between three states, as shown in FIGS. 11A-11C.

Figure 12A:
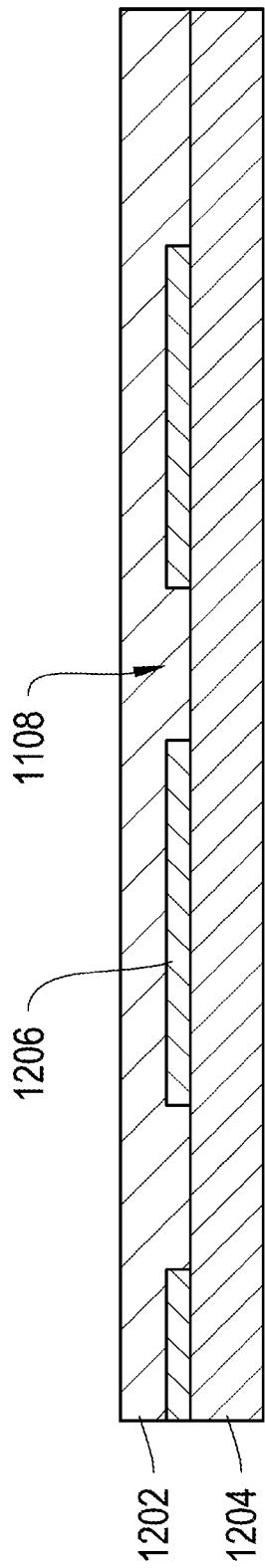
Figure 12B:
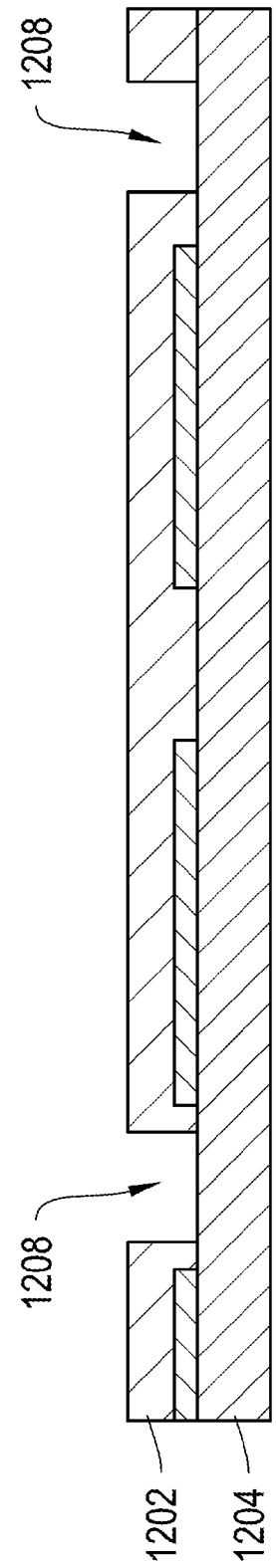

FIGS. 12A-12H show cross sectional views of example stages of the fabrication of the shutter assembly 1102 shown in FIGS. 11A-11D. Like the shutter assembly 801, shown in FIG. 8, the shutter assembly 1102 can be fabricated using the same general fabrication process 900 shown in FIG. 9. As shown in FIGS. 12A and 12B, the fabrication of the shutter assembly 1102 begins with the deposition and patterning of a first layer of sacrificial material 1202 (stage 902). Specifically, the first layer of sacrificial material 1202 is deposited on a substrate 1204 over a patterned light blocking layer 1206. The light blocking layer 1206 has been patterned to form apertures 1108 that form part of the optical path described above. The first layer of sacrificial material 1202 can be or include any of the sacrificial materials described above. The first layer of sacrificial material 1202 is patterned to form recesses 1208 that will serve as molds for the bases of the anchors 1128 shown in FIGS. 11A-D.

Figure 12C:
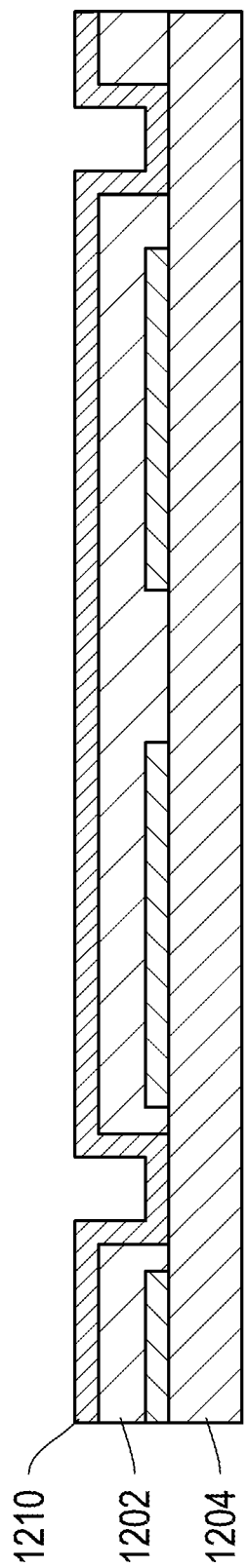

A first layer of structural material 1210 is then deposited over the patterned first layer of sacrificial material 1202 (stage 904). The first layer of structural material 1210 can be or include any of the structural materials described above, including, in some implementations, a multi-layer stack of such materials. It can be deposited to a thickness of less than about 2.0 microns. The result of such deposition is shown in FIG. 12C.

Figure 12D:
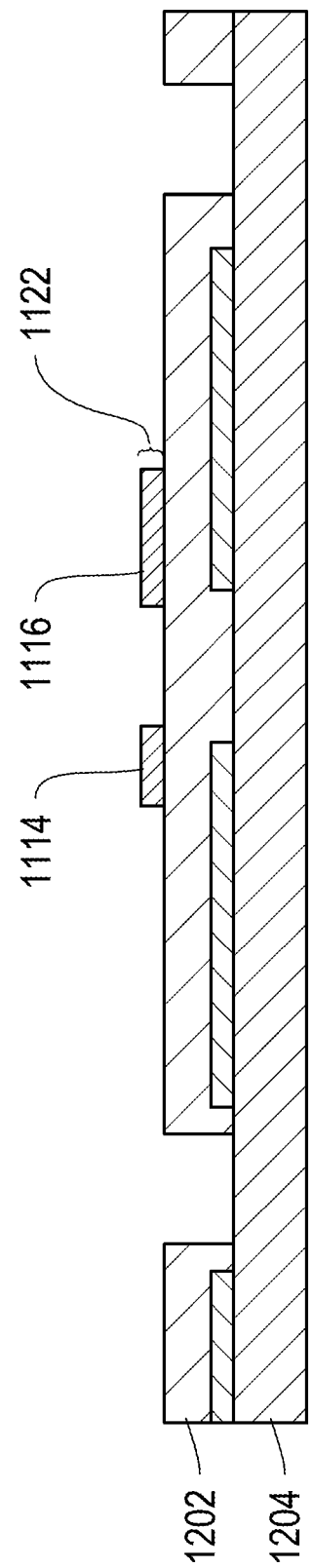

The first layer of structural material 1210 is patterned to define a proximal light obstructing level of the shutter 1110, i.e., the rear light obstructing level 1122 and the shutter aperture 1119 (stage 906). In this patterning process, the first layer of structural material 1210 is removed except where it will form the rear light obstructing level 1122. The shutter aperture 1119 is patterned to be off-center with respect to the length of the rear light obstructing level 1122, thereby defining the sizes of the short and long light blocking portions 1114 and 1116. The patterning, in some implementations, is carried out using two etches, an anisotropic etch to remove unwanted structural material on horizontal surfaces of the structure and an isotropic etch to remove undesired structural material on vertical surfaces of the structure, such as the sidewalls of the recesses 1208. The results of the patterning process are shown in FIG. 12D.

After the proximal light obstructing level and the shutter aperture are defined (stage 906), a second layer of sacrificial material 1212 is deposited over the patterned first layer of structural material 1210 (as shown in FIG. 12E), and is patterned (stage 908), yielding the structure shown in FIG. 12F. Specifically, the second layer of sacrificial material 1212 is patterned to form anchor recesses 1214, actuator recess 1216, and a shutter aperture recess 1218.

A second layer of structural material 1220 is then deposited (stage 910) over the patterned second layer of sacrificial material 1212. The second layer of structural material 1220 coats the upper surface of the second layer of sacrificial material 1212, as well as the sidewalls and bottoms of the recesses 1214, 12126, and 1218. The second layer of structural material 1220 can be or include the same materials and be substantially the same thickness as the first layer of structural material 1210. The result of this deposition is shown in FIG. 12G.

The second layer of structural material 1220 is then patterned to define the distal light obstructing level of the shutter 1110 (stage 912); i.e., the front light obstructing level 1120. At the same time, the second layer of structural material 1220 is patterned to define the anchors 1128, the actuators 1112a and 1112b, and to reopen the shutter aperture 1119, which was covered by the second layer of structural material. As with the previous structural material patterning stage, the second layer of structural material 1220 can be patterned using a single isotropic etch or a two-phase etch process, including an anisotropic etch and a isotropic etch. The resulting structure is shown in FIG. 12H. After the patterning stage (stage 912), the structure is released, yielding the shutter assembly 1102 shown in FIGS. 11A-D.

Figure 13:
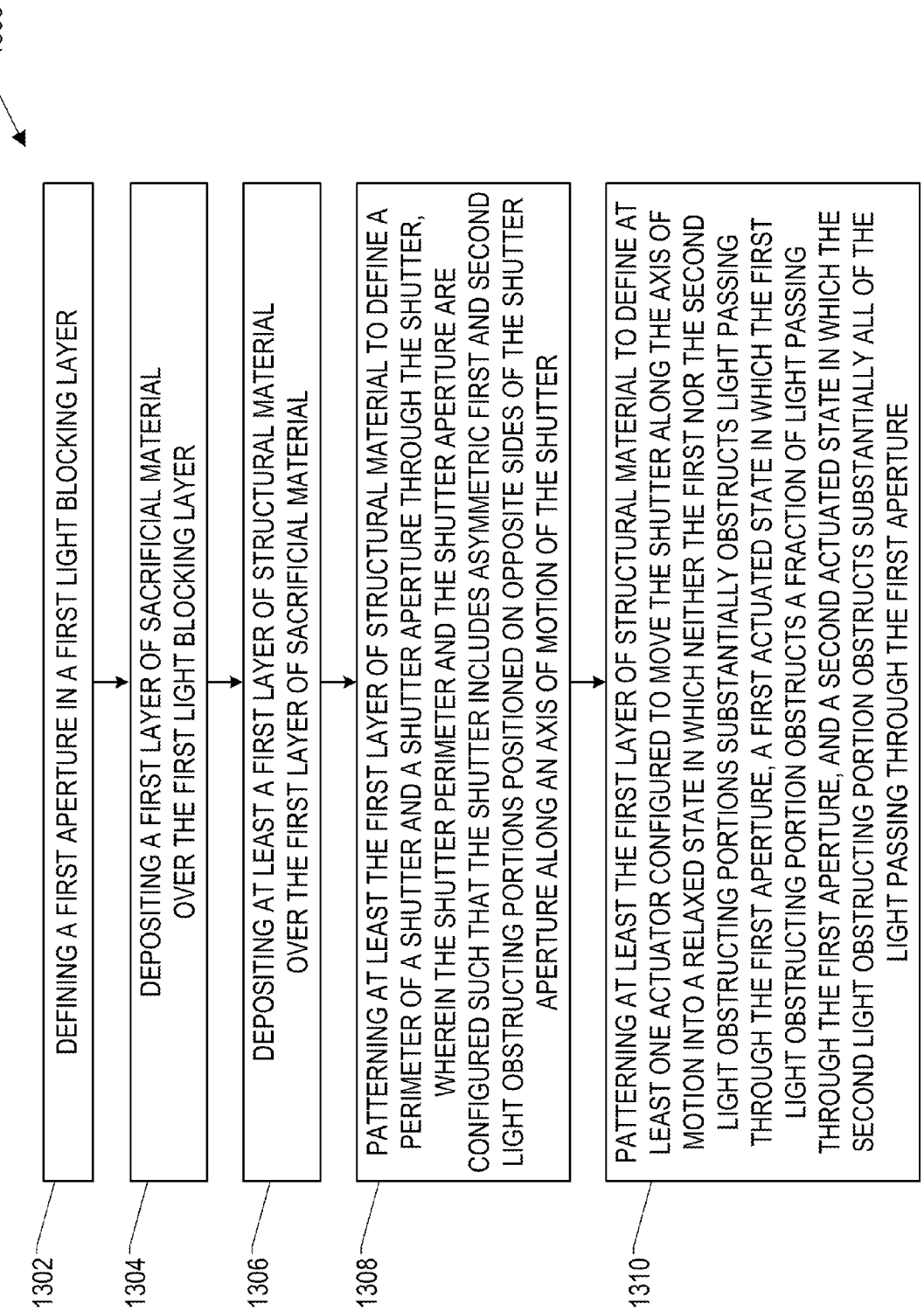
FIG. 13 shows a flow diagram of another representation of a method of manufacturing the shutter assembly shown in FIGS. 11A-11D.

FIG. 13 shows a flow diagram of another representation of a method 1300 of manufacturing the shutter assembly 1102 shown in FIGS. 11A-11D. The method includes defining a first aperture in a first light blocking layer (stage 1302), depositing a first layer of sacrificial material over the first light blocking layer (stage 1304), and depositing at least a first layer of structural material over the first layer of sacrificial material (stage 1306). The method 1300 further includes patterning at least the first layer of structural material to define a perimeter of a shutter and a shutter aperture through the shutter, wherein the shutter perimeter and the shutter aperture are configured such that the shutter includes asymmetric first and second light obstructing portions positioned on opposite sides of the shutter aperture along an axis of motion 1130 (shown in FIGS. 11A-11C) of the shutter (stage 1308) and patterning at least the first layer of structural material to define at least one actuator configured to move the shutter along the axis of motion into a relaxed state in which neither the first nor the second light obstructing portions substantially obstructs light passing through the first aperture, a first actuated state in which the first light obstructing portion obstructs a fraction of light passing through the first aperture, and a second actuated state in which the second light obstructing portion obstructs substantially all of the light passing through the first aperture (stage 1310).

As set forth above, the method 1300 includes defining a first aperture, such as the aperture 1108, shown in FIGS. 11A-11C and FIGS. 12A-12H, in a first light blocking layer (stage 1302), such as the light blocking layer 1206 shown in FIG. 12. For example, the apertures can be defined using one of a number of common photolithography processes to etch openings through a light blocking layer. In some implementations, the first light blocking layer is light absorbing. In some other implementations, the first light absorbing layer is reflective. In some other implementations, the first light blocking layer is reflective in one direction and absorptive in the opposite direction.

A first layer of sacrificial material is then deposited over the first light blocking layer (stage 1304). This process is similar to that shown in FIG. 12A. At least a first layer of structural material is then deposited over the first layer of sacrificial material (stage 1306). In some implementations, more than one layer of structural material is deposited. In some such implementations, the first layer of structural material is patterned, as discussed further below, before a second layer of sacrificial material is deposited over the first layer of structural material, and before a second layer of structural material is deposited. The structural material layer deposition process is described further above in relation to FIGS. 12C and 12G.

The method 1300 further includes patterning the deposited layer(s) of structural material (stages 1308 and 1310). More particularly, the layer(s) of structural material are patterned to define a shutter, such as the shutter 1110 shown in FIGS. 11A-11E (stage 1308) and at least one actuator, such as actuators 1112a and 1112b, also shown in FIGS. 11A-11E (stage 1310). The shutter is defined by patterning the perimeter of the shutter as well as a shutter aperture, such as the shutter aperture 1109 shown in FIGS. 11A-11E. The perimeter and shutter aperture are patterned such that the shutter includes asymmetric first and second light blocking portions on either side of the shutter aperture along an axis of motion of the shutter. The short and long light blocking portions 1114 and 1116 of the shutter 1110 shown in FIG. 11 are examples of such asymmetric first and second light blocking portions.

The at least one actuator is defined such that the actuator(s) can move the shutter along the axis of motion between three states. In a relaxed state, neither the first nor the second light blocking portion substantially obstructs light passing through the aperture defined in the first light blocking layer in stage 1302. In a first actuated state, the at least one actuator moves the shutter into a position in which first light obstructing portion obstructs a fraction, but not substantially all, of the light passing through the first aperture. In a second actuated state, the at least one actuator moves the shutter into a position in which the second light obstructing portion obstructs substantially all of the light passing through the first aperture. The patterning process resulting in the above-described shutter and at least one actuator is described above in relation to FIGS. 12D and 12H. The operation of the at least one actuator is shown in FIGS. 11A-11C.

Figure 14:
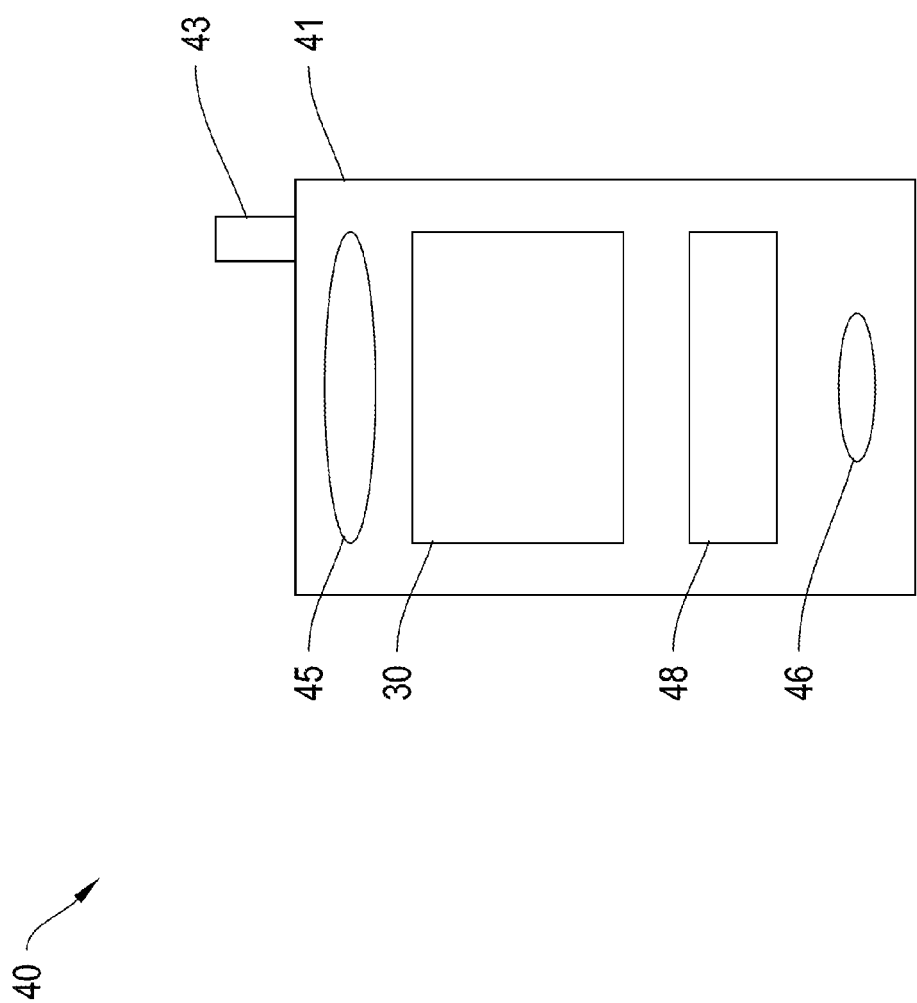
FIGS. 14 and 15 show system block diagrams of an example display device that includes a set of display elements.
Figure 15:
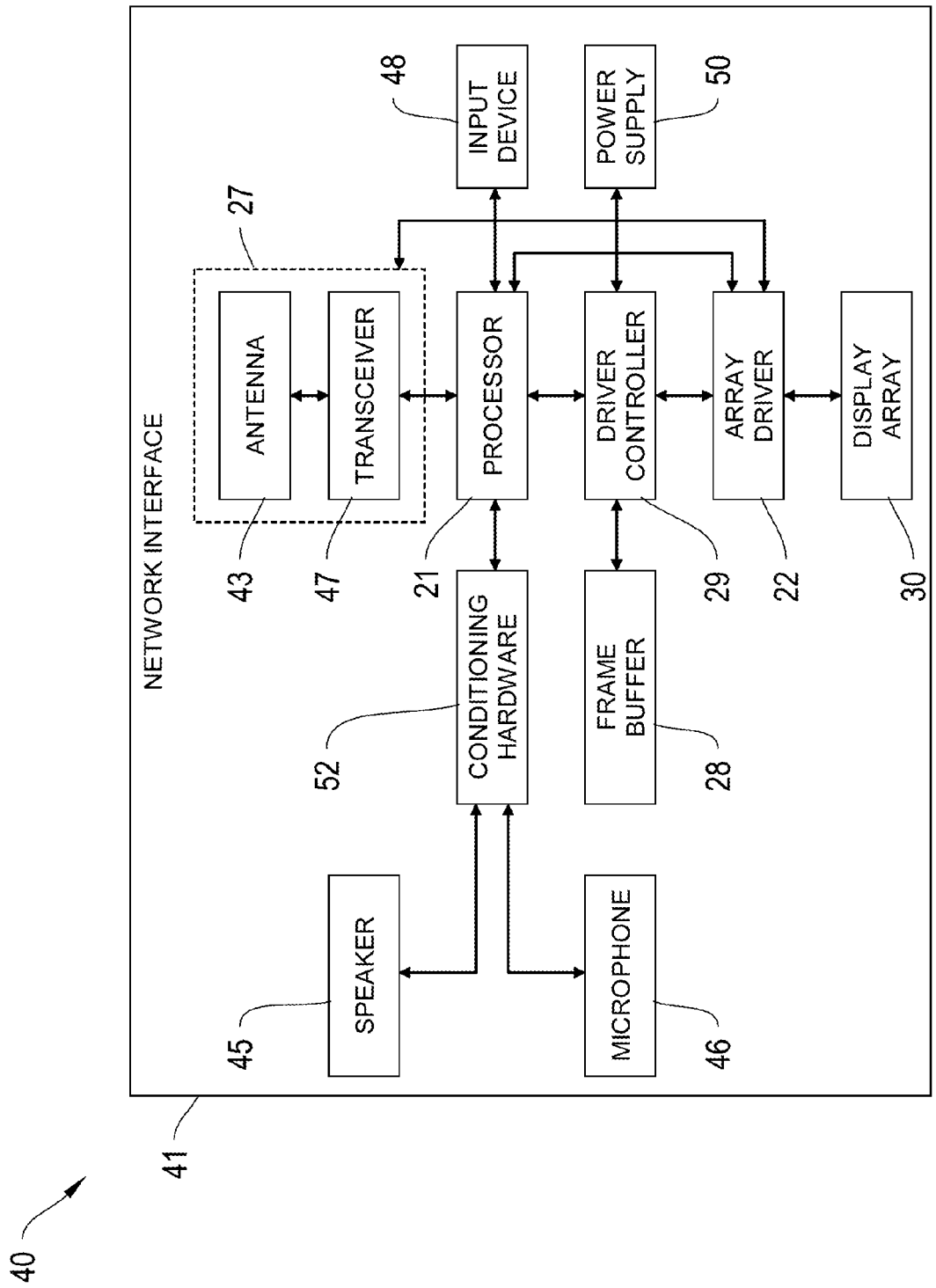

FIGS. 14 and 15 show system block diagrams of an example display device 40 that includes a set of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, electroluminescent (EL) displays, OLED, super twisted nematic (STN) displays, LCD, or thin film transistors (TFT) LCD, or a non-flat-panel display, such as a cathode ray tube (CRT) or other tube device. In addition, the display 30 can include a mechanical light modulator-based display as described herein.

The components of the display device 40 are schematically illustrated in FIG. 14. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 14, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller. Additionally, the array driver 22 can be a conventional driver or a bi-stable display driver. Moreover, the display array 30 can be a conventional display array or a bi-stable display array. In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blue-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A apparatus comprising:
    a first light blocking layer including an aperture formed therein; and
    a shutter configured to be moved laterally along a first axis with respect to the light blocking layer by at least one actuator, the shutter including:
        a first light obstructing portion having a dimension along the first axis which is smaller than a dimension of the aperture along the first axis; and
        a second light obstructing portion having a dimension along the first axis which is greater than or equal to the dimension of the aperture along the first axis,
    wherein:
        the at least one actuator is configured to move the shutter into a first state in which neither the first or the second light obstructing portion substantially obstructs light passing through the aperture, a second state in which the first light obstructing portion obstructs a fraction of light passing through the aperture, and a third state in which the second light obstructing portion obstructs substantially all of the light passing through the aperture; and
        each of the first and second light obstructing portions of the shutter includes a proximal light obstructing level and a distal light obstructing level, which are connected by sidewalls.

2. The apparatus of claim 1, wherein the at least one actuator includes an electrode positioned adjacent the shutter, and the proximal light obstructing level is positioned at about the same height over a substrate as a proximal edge of the electrode.

3. The apparatus of claim 2, wherein the proximal light obstructing level is positioned at about the same height over a substrate as a proximal edge of the electrode.

4. The apparatus of claim 2, wherein the distal light obstructing level is positioned at about the same height over a substrate as a distal edge of the electrode.

5. The apparatus of claim 1, wherein the proximal light obstructing level is spaced from the first light blocking layer by about the same distance as the distal light obstructing level is spaced from a second light blocking layer positioned opposite the shutter from the first light blocking layer.

6. The apparatus of claim 1, wherein the proximal light obstructing level is spaced from the first light blocking layer by a distance that is less than about 3 microns different from a distance with which the distal light obstructing level is spaced from a second light blocking layer positioned opposite the shutter from the first light blocking layer.

7. The apparatus of claim 1, wherein the at least one actuator includes a first actuator and a second actuator.

8. The apparatus of claim 7, wherein the first actuator is configured to, upon actuation, pull the shutter into the second state.

9. The apparatus of claim 8, wherein the second actuator is configured to, upon actuation, pull the shutter into the third state.

10. The apparatus of claim 7, wherein the first and second actuators are configured such that when neither the first or second actuator is actuated, the shutter is in the first state.

11. The apparatus of claim 1, comprising:
    a display including the shutter;
    a processor that is configured to communicate with the display, the processor being configured to process image data; and
    a memory device that is configured to communicate with the processor.

12. The apparatus of claim 11, further comprising:
    a driver circuit configured to send at least one signal to the display; and wherein
    the processor is further configured to send at least a portion of the image data to the driver circuit.

13. The apparatus of claim 11, further comprising:
    an image source module configured to send the image data to the processor, wherein the image source module comprises at least one of a receiver, transceiver, and transmitter.

14. The apparatus of claim 11, further comprising:
    an input device configured to receive input data and to communicate the input data to the processor.

15. A method of manufacturing a display element, comprising:
    defining a first aperture in a first light blocking layer;
    depositing a first layer of sacrificial material over the first light blocking layer;
    depositing at least a first layer of structural material over the first layer of sacrificial material; and
    patterning at least the first layer of structural material to define:
        a perimeter of a shutter and a shutter aperture through the shutter, wherein the shutter perimeter and the shutter aperture are configured such that the shutter includes asymmetric first and second light obstructing portions positioned on opposite sides of the shutter aperture along an axis of motion of the shutter; and
        at least one actuator configured to move the shutter along the axis of motion into a relaxed state in which neither the first nor the second light obstructing portions substantially obstructs light passing through the first aperture, a first actuated state in which the first light obstructing portion obstructs a fraction of light passing through the first aperture, and a second actuated state in which the second light obstructing portion obstructs substantially all of the light passing through the first aperture.

16. The method of claim 15, further comprising depositing a second layer of sacrificial material over the first layer of structural material, wherein depositing at least a first layer of structural material over the first layer of sacrificial material includes depositing a second layer of structural material over the second layer of sacrificial material.

17. The method of claim 16, wherein patterning at least the first layer of structural material includes patterning the first layer of structural material prior to the deposition of the second layer of sacrificial material and then patterning the second layer of structural material after the deposition of the second layer of structural material.

18. The method of claim 17, further comprising patterning the second layer of sacrificial material to form a recess in the second layer of sacrificial material surrounding the shutter aperture defined in the first layer of structural material.

19. The method of claim 18, wherein depositing the second layer of structural material includes coating sidewalls of the recess in the second sacrificial layer with the second layer of structural layer.

20. A apparatus comprising:
a first light blocking layer including an aperture formed therein; and
a shutter configured to be moved laterally along a first axis with respect to the light blocking layer by at least one actuator, the shutter including:
a first light obstructing portion having a dimension along the first axis which is smaller than a dimension of the aperture along the first axis; and
a second light obstructing portion having a dimension along the first axis which is greater than or equal to the dimension of the aperture along the first axis, the first light obstructing portion and the second light obstructing portion positioned on opposite sides of a shutter aperture,
wherein the at least one actuator is configured to move the shutter into a first state in which neither the first or the second light obstructing portion substantially obstructs light passing through the aperture, a second state in which the first light obstructing portion obstructs a fraction of light passing through the aperture, and a third state in which the second light obstructing portion obstructs substantially all of the light passing through the aperture.

21. The apparatus of claim 20, wherein each of the first and second light obstructing portions of the shutter includes a proximal light obstructing level and a distal light obstructing level, which are connected by sidewalls.

22. The apparatus of claim 21, wherein the at least one actuator includes an electrode positioned adjacent the shutter, and the proximal light obstructing level is positioned at about the same height over a substrate as a proximal edge of the electrode.

23. The apparatus of claim 22, wherein the proximal light obstructing level is positioned at about the same height over a substrate as a proximal edge of the electrode.

24. The apparatus of claim 22, wherein the distal light obstructing level is positioned at about the same height over a substrate as a distal edge of the electrode.

25. The apparatus of claim 21, wherein the proximal light obstructing level is spaced from the first light blocking layer by about the same distance as the distal light obstructing level is spaced from a second light blocking layer positioned opposite the shutter from the first light blocking layer.

26. The apparatus of claim 21, wherein the proximal light obstructing level is spaced from the first light blocking layer by a distance that is less than about 3 microns different from a distance with which the distal light obstructing level is spaced from a second light blocking layer positioned opposite the shutter from the first light blocking layer.

27. The apparatus of claim 20, wherein the at least one actuator includes a first actuator and a second actuator.

28. The apparatus of claim 27, wherein the first actuator is configured to, upon actuation, pull the shutter into the second state.

29. The apparatus of claim 28, wherein the second actuator is configured to, upon actuation, pull the shutter into the third state.

30. The apparatus of claim 27, wherein the first and second actuators are configured such that when neither the first or second actuator is actuated, the shutter is in the first state.

31. The apparatus of claim 20, comprising:
a display including the shutter;
a processor that is configured to communicate with the display, the processor being configured to process image data; and
a memory device that is configured to communicate with the processor.

32. The apparatus of claim 31, further comprising:
a driver circuit configured to send at least one signal to the display; and wherein
the processor is further configured to send at least a portion of the image data to the driver circuit.

33. The apparatus of claim 31, further comprising:
an image source module configured to send the image data to the processor, wherein the image source module comprises at least one of a receiver, transceiver, and transmitter.

34. The apparatus of claim 31, further comprising:
an input device configured to receive input data and to communicate the input data to the processor.

* * * * *